US012067912B2

(12) United States Patent
 Tanaka

(10) Patent No.: US 12,067,912 B2
(45) Date of Patent: Aug. 20, 2024

(54) DISPLAY DRIVER AND DISPLAY MODULE

(71) Applicant: SEIKO EPSON CORPORATION, Tokyo (JP)

(72) Inventor: Kazuaki Tanaka, Nagano (JP)

(73) Assignee: SEIKO EPSON CORPORATION (JP)

( * ) Notice: Subject to any disclaimer, the term of this patent is extended or adjusted under 35 U.S.C. 154(b) by 0 days.

(21) Appl. No.: 17/898,807

(22) Filed: Aug. 30, 2022

(65) Prior Publication Data

US 2023/0063763 A1 Mar. 2, 2023

(30) Foreign Application Priority Data

Aug. 31, 2021 (JP) ................................. 2021-141124

(51) Int. Cl.
 *G09G 3/00* (2006.01)
 *G02F 1/133* (2006.01)
 *G09G 3/36* (2006.01)
 *H05K 9/00* (2006.01)

(52) U.S. Cl.
 CPC ......... *G09G 3/006* (2013.01); *G02F 1/13306* (2013.01); *G09G 3/3648* (2013.01); *H05K 9/0067* (2013.01); *G02F 2202/22* (2013.01); *G09G 2330/04* (2013.01)

(58) Field of Classification Search
 None
 See application file for complete search history.

(56) References Cited

U.S. PATENT DOCUMENTS

| 2018/0018913 | A1* | 1/2018 | Kim ..................... G09G 3/2092 |
| 2020/0135153 | A1* | 4/2020 | Ogawa ..................... G09G 5/38 |
| 2020/0169437 | A1* | 5/2020 | Miyashita ............... G06F 1/105 |
| 2020/0184916 | A1* | 6/2020 | Morita ................. G09G 3/3614 |
| 2020/0209665 | A1  | 7/2020 | Kobayashi et al. |
| 2020/0211491 | A1* | 7/2020 | Muraki .................... G09G 3/04 |
| 2020/0242987 | A1  | 7/2020 | Kobayashi |
| 2021/0097953 | A1  | 4/2021 | Tanaka |
| 2021/0125534 | A1* | 4/2021 | Yamaguchi .......... G09G 3/3688 |
| 2021/0158771 | A1* | 5/2021 | Tanaka ................. G09G 3/3696 |

FOREIGN PATENT DOCUMENTS

| JP | 2020-106632 A | 7/2020 |
| JP | 2020-106633 A | 7/2020 |
| JP | 2020-118912 A | 8/2020 |
| JP | 2021-056344 A | 4/2021 |
| JP | 2021-081639 A | 5/2021 |

* cited by examiner

*Primary Examiner* — Andre L Matthews
(74) *Attorney, Agent, or Firm* — Harness, Dickey & Pierce, P.L.C.

(57) ABSTRACT

A display driver includes: a driver circuit that drives an electro-optical panel; an output terminal that outputs an output signal from the driver circuit; an output line that couples the output of the driver circuit and the output terminal; and an inspection circuit that detects an abnormality of the output signal output by the driver circuit to the output line by monitoring a voltage of the output signal. The inspection circuit determines whether the voltage of the output signal is abnormal by comparing the voltage of the output signal with a reference voltage whose voltage changes in each given cycle.

18 Claims, 18 Drawing Sheets

FIG. 23

| FIRST COMMAND | VREFH |
|---|---|
| 0 | 0.70V |
| 1 | 0.75V |
| 2 | 0.80V |
| 3 | 0.85V |
| 4 | 0.90V |
| 5 | 0.95V |

FIG. 24

| SECOND COMMAND | VREFL |
|---|---|
| 0 | 0.05V |
| 1 | 0.10V |
| 2 | 0.15V |
| 3 | 0.20V |
| 4 | 0.25V |
| 5 | 0.30V |

DISPLAY DRIVER AND DISPLAY MODULE

The present application is based on, and claims priority from JP Application Serial Number 2021-141124, filed Aug. 31, 2021, the disclosure of which is hereby incorporated by reference herein in its entirety.

BACKGROUND

1. Technical Field

The present disclosure relates to a display driver, a display module, and the like.

2. Related Art

JP-A-2021-56344 discloses a common driver for a display panel. The common driver includes: a voltage output circuit that outputs inspection voltages different in a first period and a second period to an inspection voltage output line, and that outputs a first voltage to a first segment electrode and outputs a second voltage to a second segment electrode in the first period and the second period; a signal output circuit that outputs, to a signal voltage output line, a voltage of a first signal in the first period and a voltage of a second signal in the second period; and an inspection circuit that inspects whether an abnormality occurs based on the voltage of the inspection voltage output line and the voltage of the signal voltage output line. According to the common driver, an abnormality of a voltage applied to an electrode of the display panel can be detected.

In the common driver for a display panel disclosed in JP-A-2021-56344, since a value of a reference voltage set to determine whether an output voltage of an output signal of the common driver is normal is fixed, an abnormal state may not be properly determined depending on a value of an output voltage in the abnormal state.

SUMMARY

An aspect of the present disclosure relates to a display driver including: a driver circuit that drives an electro-optical panel; an output terminal that outputs an output signal from the driver circuit; an output line that couples the output of the driver circuit and the output terminal; and an inspection circuit that detects an abnormality of the output signal output by the driver circuit to the output line by monitoring a voltage of the output signal. The inspection circuit determines whether the voltage of the output signal is abnormal by comparing the voltage of the output signal with a reference voltage whose voltage changes in each given cycle.

Another aspect of the present disclosure relates to a display module including the display driver described above and the electro-optical panel.

BRIEF DESCRIPTION OF THE DRAWINGS

FIG. 23 is an example of command setting of a first reference voltage.

FIG. 24 is an example of command setting of a second reference voltage.

DESCRIPTION OF EXEMPLARY EMBODIMENTS

Hereinafter, the present embodiment will be described. The present embodiment to be described below does not unduly limit contents described in the claims. All configurations described in the present embodiment are not necessarily essential constituent elements.

1. Display Driver

Figure 1:
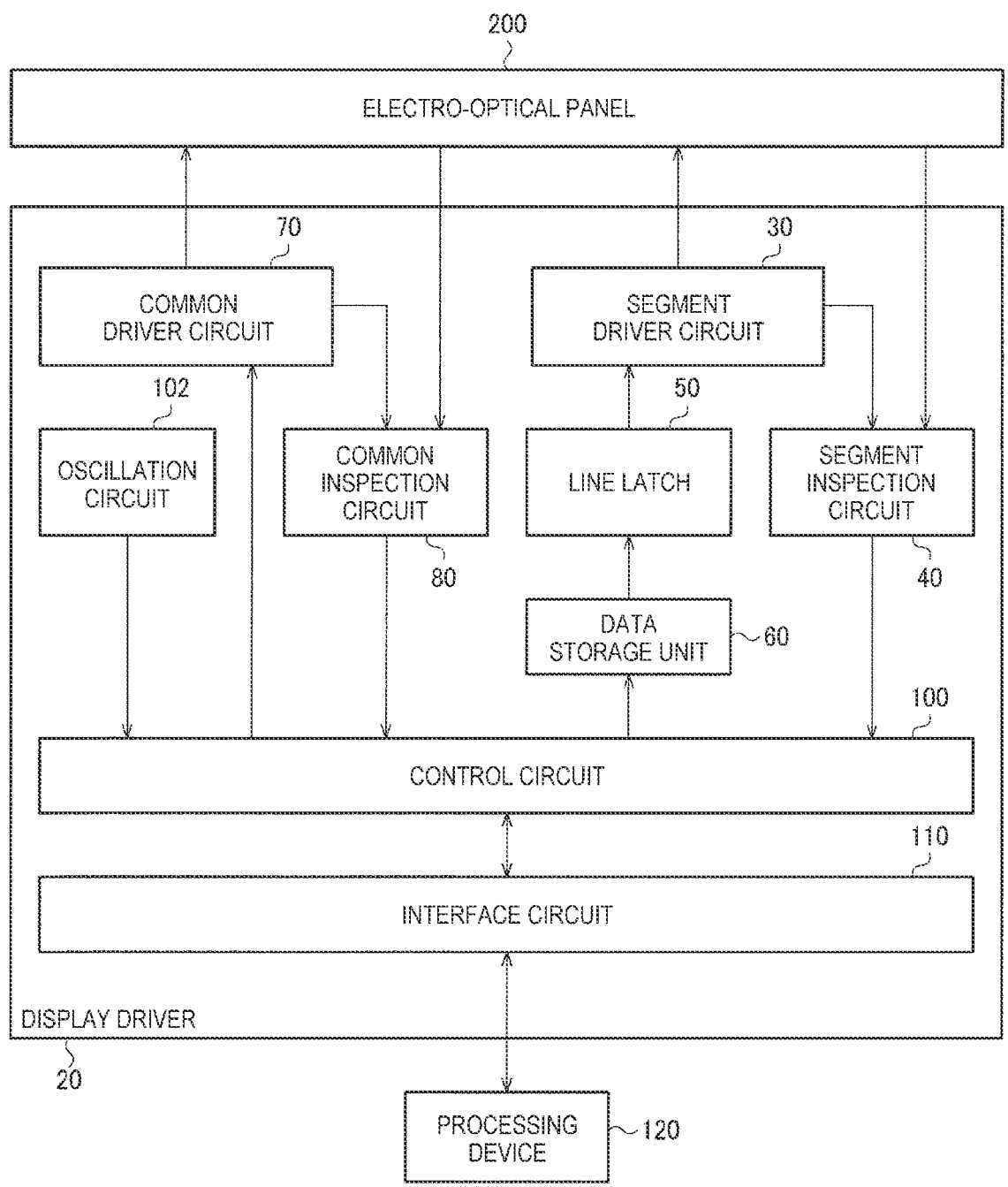
FIG. 1 is a configuration example of a display driver according to the present embodiment.

FIG. 1 shows a configuration example of a display driver 20 according to the present embodiment. The display driver 20 includes a segment driver circuit 30, a common driver circuit 70, a segment inspection circuit 40, a common inspection circuit 80, a line latch 50, a data storage unit 60, an oscillation circuit 102, a control circuit 100, and an interface circuit 110. A processing device 120 is provided outside the display driver 20. The processing device 120 can communicate with the display driver 20 about, for example, information to be displayed on an electro-optical panel 200. Based on a signal from the display driver 20, the electro-optical panel 200 displays numbers and the like to be displayed by segments described later with reference to FIGS. 2 and 3.

The interface circuit 110 communicates between the display driver 20 and the processing device 120. Specifically, the interface circuit 110 receives segment drive data SGD from the processing device 120. The segment drive data SGD is data for controlling display of the electro-optical panel 200 described later with reference to FIGS. 2 and 3. For example, in the case of static driving, the segment drive data SGD is data for turning on or off the display of the electro-optical panel 200. Alternatively, when PWM drive is executed in the static driving, the segment drive data SGD is data for setting a display gradation of the electro-optical panel 200.

The processing device 120 is a host device of the display driver 20. The processing device 120 is, for example, a processor or a display controller. Here, the processor is a CPU, a microcomputer, or the like. For example, a serial interface method such as an inter integrated circuit (I2C) method or a serial peripheral interface (SPI) method can be adopted as a communication method of the interface circuit 110. Alternatively, a parallel interface method may be adopted as the communication method of the interface circuit 110. The interface circuit 110 can include an input and output buffer circuit and a control circuit that implement these communication methods.

The control circuit 100 is, for example, a logic circuit that operates based on a clock signal received from the oscillation circuit 102. The control circuit 100 executes overall control necessary for driving the electro-optical panel 200. Specifically, the control circuit 100 controls the segment driver circuit 30 and the common driver circuit 70, monitors a display state of the electro-optical panel 200 described later with reference to FIG. 4, and the like.

The data storage unit 60 mainly stores information received from the control circuit 100. The data storage unit 60 is, for example, a RAM. Alternatively, the data storage unit 60 may be a register.

The line latch 50 latches segment drive data for one frame read from the data storage unit 60. The line latch 50 is implemented by, for example, a flip-flop circuit.

The segment driver circuit 30 drives the electro-optical panel 200. The segment driver circuit 30 supplies a voltage to a segment electrode ES described later with reference to FIG. 2. Specifically, the segment driver circuit 30 supplies a voltage to the segment electrode ES by outputting a segment drive signal according to a polarity thereof from a segment terminal.

The common driver circuit 70 drives the electro-optical panel 200 together with the segment driver circuit 30. The common driver circuit 70 supplies a voltage to a common electrode EC described later with reference to FIG. 3. Specifically, the common driver circuit 70 supplies a voltage to the common electrode EC by outputting a common drive signal according to a polarity thereof from a common terminal. The common drive signal is a low-level signal when the polarity is positive, and is a high-level signal when the polarity is negative.

The segment inspection circuit 40 inspects whether the display of the electro-optical panel 200 is normally executed. Specifically, the segment inspection circuit 40 inspects whether a voltage of an output signal of the segment driver circuit 30 is the desired voltage. The segment inspection circuit 40 outputs the inspection result to the control circuit 100. When the inspection result indicates a drive abnormality, the control circuit 100 notifies the processing device 120 of the drive abnormality via the interface circuit 110.

Similarly to the segment inspection circuit 40, the common inspection circuit 80 also inspects whether the display of the electro-optical panel 200 is normally executed. Here, unlike the segment inspection circuit 40, the common inspection circuit 80 inspects whether a voltage of an output signal of the common driver circuit 70 is the desired voltage. The common inspection circuit 80 outputs the inspection result to the control circuit 100. When the inspection result indicates a drive abnormality, the control circuit 100 notifies the processing device 120 of the drive abnormality via the interface circuit 110.

Figure 2:
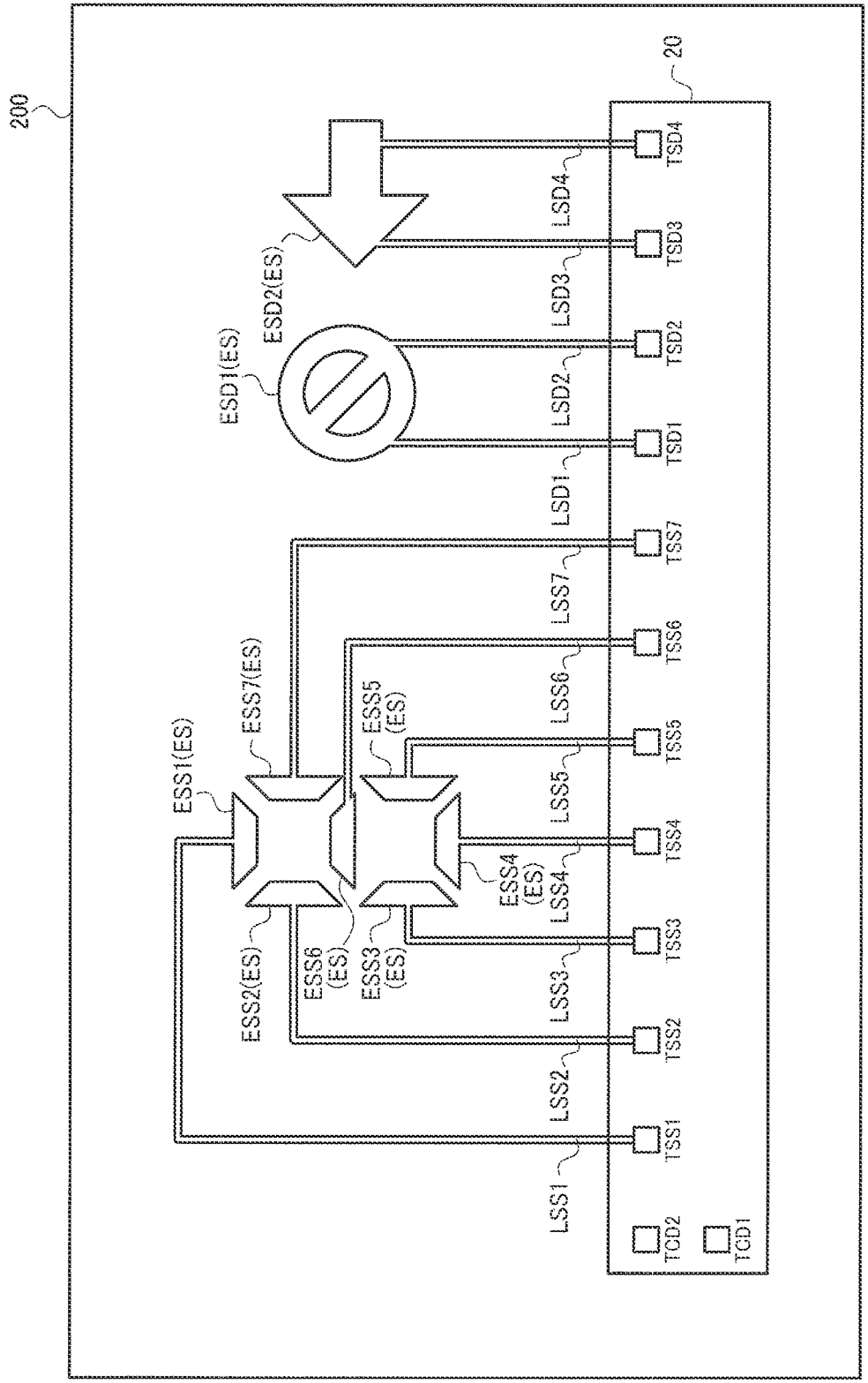
FIG. 2 is a diagram showing a wiring state between the display driver and segment electrodes of an electro-optical panel.
Figure 3:
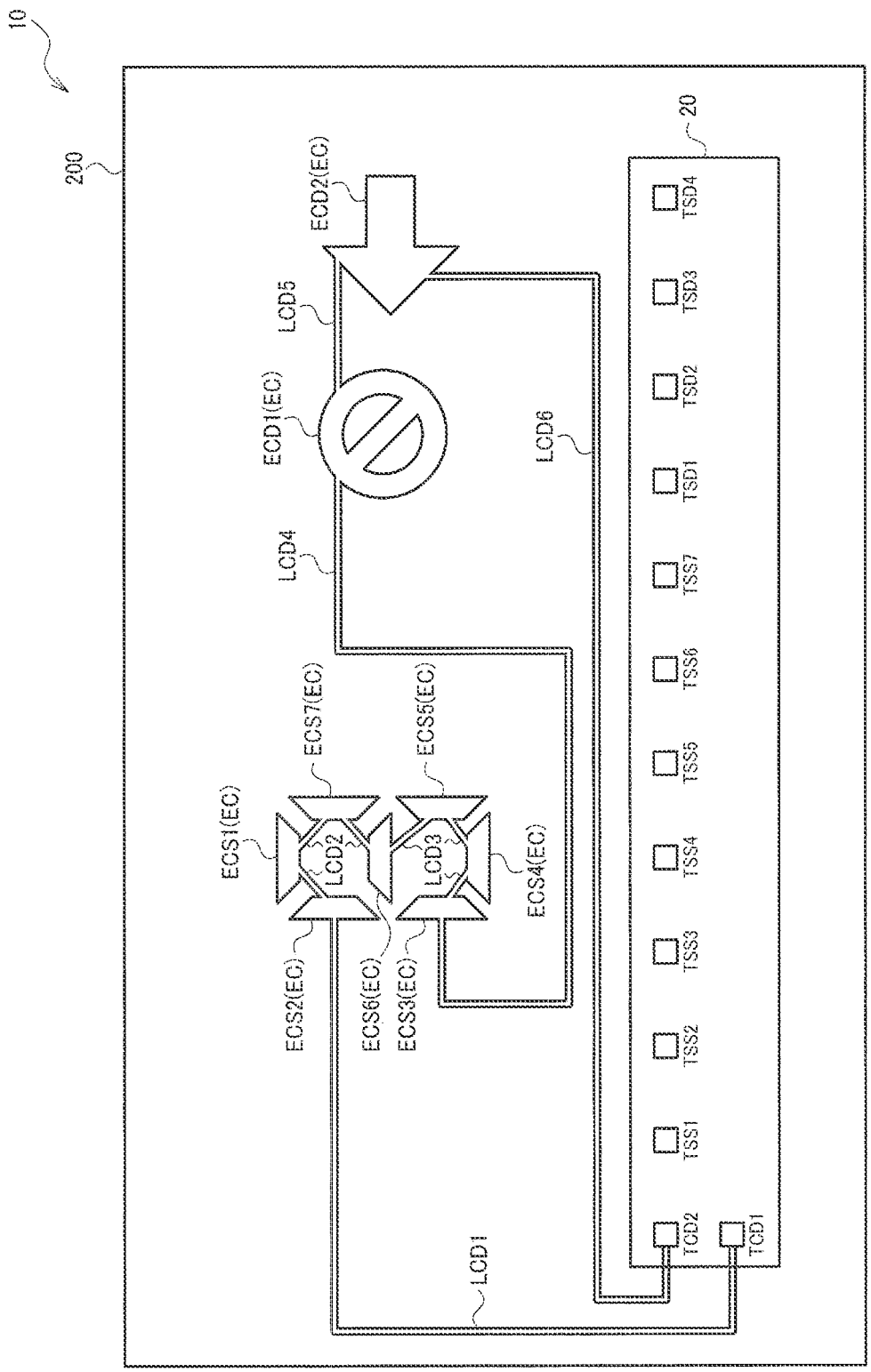
FIG. 3 is a diagram showing a wiring state between the display driver and common electrodes of the electro-optical panel.

FIGS. 2 and 3 are diagrams showing wiring states of the electro-optical panel 200 and the display driver 20. FIG. 2 shows a coupling example between the display driver 20 and the segment electrode ES, and FIG. 3 shows a coupling example between the display driver 20 and the common electrode EC. The electro-optical panel 200 includes a glass substrate at which the segment electrode ES is provided, a glass substrate at which the common electrode EC is provided, and a liquid crystal provided therebetween.

As shown in FIG. 2, the electro-optical panel 200 includes segment electrodes ESD1, ESD2, and ESS1 to ESS7, and segment signal lines LSD1 to LSD4 and LSS1 to LSS7. In the present embodiment, these segment electrodes and segment signal lines are collectively referred to as a segment electrode ES and a segment signal line LS as appropriate. The display driver 20 includes segment terminals TSD1 to TSD4 and TSS1 to TSS7, and common terminals TCD1 and TCD2. As shown in FIG. 3, the electro-optical panel 200 includes common electrodes ECD1, ECD2, and ECS1 to ECS7, and common signal lines LCD1 to LSD6. In the present embodiment, these common electrodes and common signal lines are collectively referred to as a common electrode EC and a common signal line LC as appropriate. The segment electrode ES and the segment signal line LS are transparent conductive films provided on the glass substrate. The transparent conductive film is, for example, indium tin oxide (ITO). A portion of the transparent conductive film that faces the common electrode EC with the liquid crystal interposed therebetween is the segment electrode ES, and a portion that supplies the segment drive signal to the segment electrode ES is the segment signal line LS. For example, the segment electrode ESD1 and the segment signal lines LSD1 and LSD2 are formed of an integrated transparent conductive film. A portion of the transparent conductive film that faces the common electrode ECD1 in FIG. 3 is the segment electrode ESD1. In the following description, either of the segment signal line LS and the common signal line LC is appropriately referred to as a panel signal line LPN, and each of the segment terminals TSD1 to TSD4 and TSS1 to TSS7 and the common terminals TCD1 and TCD2 is referred to as an output terminal TO.

The display driver 20 is mounted on the glass substrate of the electro-optical panel 200. Specifically, the display driver 20 is an integrated circuit device, and pads formed on a semiconductor substrate of the display driver 20 correspond to the segment terminals TSD1 to TSD4 and TSS1 to TSS7. The semiconductor substrate is mounted at the electro-optical panel 200 such that a surface at which the pads are provided faces the glass substrate of the electro-optical panel 200. At this time, the segment terminal TSD1 is coupled to the segment signal line LSD1 via, for example, a metal bump. Similarly, the segment terminals TSD2 to TSD4 are coupled to the segment signal lines LSD2 to LSD4, and the segment terminals TSS1 to TSS7 are coupled to the segment signal lines LSS1 to LSS7. In FIG. 2, originally, in the surface of the semiconductor substrate, a surface at which no segment terminal is provided can be seen, but the segment terminals and the like hidden in the semiconductor substrate are also shown.

The display driver 20 supplies a voltage to the segment electrode ESD1 via the segment signal line LSD1 by outputting a segment drive signal from the segment terminal TSD1. The segment electrode ESD1 has a predetermined icon shape, and the display driver 20 supplies a voltage to the segment electrode ESD1 to control the display or non-display of the icon. Then, the segment drive signal is fed back from the segment electrode ESD1 to the segment terminal TSD2 via the segment signal line LSD2. The fed back segment drive signal is called a segment monitor signal. The display driver 20 detects an abnormality of the voltage supplied to the segment electrode ESD1 based on a segment monitor signal input to the segment terminal TSD2. The abnormality is, for example, that a voltage of the segment drive signal to be originally applied to the segment electrode ES is not applied. There is the abnormality due to, for example, an abnormality of a segment signal line, coupling failure of a segment terminal, an abnormality of a segment drive signal, and the like.

Similarly, the display driver 20 supplies a voltage to the segment electrode ESD2 by outputting a segment drive signal from the segment terminal TSD3. Then, the display driver 20 detects an abnormality of the voltage supplied to the segment electrode ESD2 based on a segment monitor signal input to the segment terminal TSD4.

The display driver 20 outputs segment drive signals from the segment terminals TSS1 to TSS7 to supply voltages to the segment electrodes ESS1 to ESS7 via the segment signal lines LSS1 to LSS7.

2. Detailed Configuration Example

Figure 4:
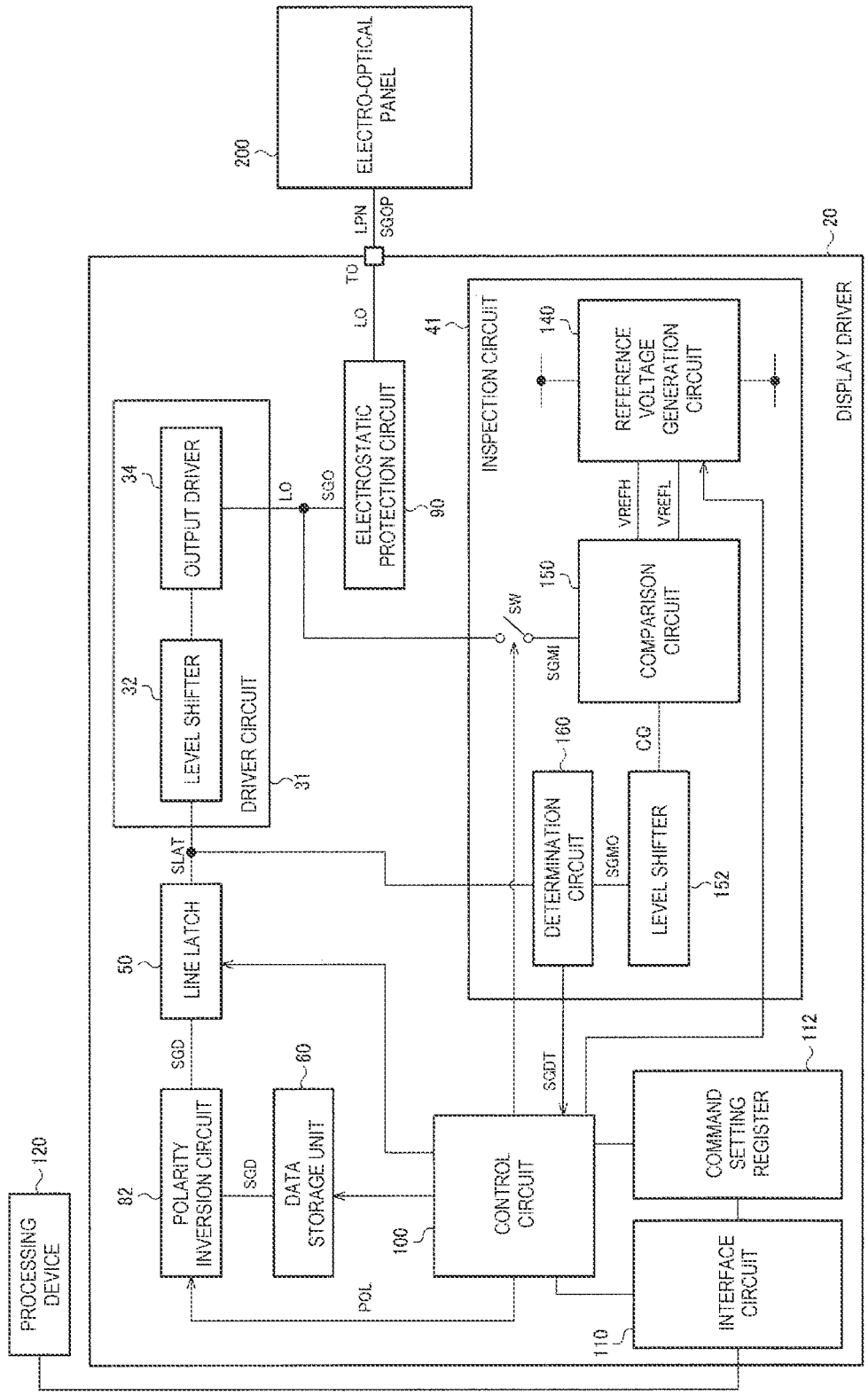
FIG. 4 is a detailed configuration example of the display driver according to the present embodiment.

FIG. 4 shows a detailed configuration example of the display driver 20 according to the present embodiment. The display driver 20 in FIG. 4 includes a polarity inversion circuit 82, an electrostatic protection circuit 90, and the output terminal TO in addition to the configuration of the display driver 20 shown in FIG. 1. A driver circuit 31 includes a level shifter 32 and an output driver 34. An inspection circuit 41 includes a reference voltage generation circuit 140, a comparison circuit 150, a level shifter 152, a determination circuit 160, and a switch SW. The driver circuit 31 in FIG. 4 corresponds to the segment driver circuit 30 and the common driver circuit 70, and the inspection circuit 41 corresponds to the segment inspection circuit 40 and the common inspection circuit 80.

The polarity inversion circuit 82 executes polarity inversion processing of the segment drive data SGD based on a polarity signal POL from the control circuit 100. That is, the polarity inversion circuit 82 outputs segment drive data SGD having the same logic level as the segment drive data SGD in a positive frame, and outputs segment drive data SGD obtained by inverting the logic level of the segment drive data SGD in a negative frame.

The level shifter 32 of the driver circuit 31 shifts a level of a segment signal SLAT. Specifically, the level shifter 32 outputs a signal having the same waveform as the received segment signal SLAT but having a different voltage from the received segment signal SLAT. The level shifter 32 can include an inverter, a MOS transistor, a resistance element, and the like.

The output driver 34 outputs an output signal SGO to the electrostatic protection circuit 90 based on the signal output from the level shifter 32. The output driver 34 can be implemented by, for example, an inverter including a P-type transistor and an N-type transistor.

The output terminal TO is an external coupling terminal of the display driver 20. When a voltage is supplied from the display driver 20 to the segment electrode ES and the common electrode EC of the electro-optical panel 200, the voltage is supplied from the output terminal TO. As described above with reference to FIGS. 2 and 3, TCD1, TCD2, TSS1 to TSS7, and TSD1 to TSD4 correspond to the output terminal TO in FIG. 4.

An output line LO is an electrical wiring that electrically couples the driver circuit 31 and the output terminal TO. The output signal SGO output from the driver circuit 31 is input to the electrostatic protection circuit 90 via the output line LO. Then, the output signal SGO is input to the electro-optical panel 200 from the output terminal TO via the panel signal line LPN. Here, an output signal output from the output terminal TO to the electro-optical panel 200 is referred to as an output signal SGOP that is distinguished from the output signal SGO inside the display driver 20. Thus, the voltage is supplied to the segment electrode ES of the electro-optical panel 200.

The reference voltage generation circuit 140 generates a reference voltage VREF serving as a reference when the inspection circuit 41 determines whether a voltage of the output signal SGO is a predetermined voltage. Then, the generated reference voltage VREF is output to the comparison circuit 150. The reference voltage generation circuit 140 can be implemented by, for example, a bandgap reference circuit, a circuit using a work function difference of a gate, or a circuit using a difference in a threshold voltage due to a change in channel impurity concentration.

As described above, the display driver 20 according to the present embodiment includes: a driver circuit that drives the electro-optical panel 200; the output terminal TO that outputs the output signal SGO from the driver circuit; the output line LO that couples the output of the driver circuit and the output terminal TO; and the inspection circuit 41 that detects an abnormality of the output signal SGO output by the driver circuit to the output line LO by monitoring the voltage of the output signal. The inspection circuit 41 determines whether the voltage of the output signal is abnormal by comparing the voltage of the output signal with the reference voltage VREF whose voltage changes in each given cycle. For example, in a certain reference voltage VREF setting, it may not be possible to correctly determine whether the voltage of the output signal SGO is the desired voltage. However, according to the present embodiment, it is possible to change the reference voltage VREF in each given cycle, and it is possible to reliably detect an abnormality of the output signal SGO according to each abnormal state. In the display driver 20 according to the present embodiment, the given cycle is a frame cycle T, and the inspection circuit 41 may compare the voltage of the output signal SGO with the reference voltage VREF whose voltage changes in each frame cycle T. Thus, an abnormal state of the voltage of the output signal SGO of the driver circuit 31 can be detected within a period of the frame cycle T. Further, the given cycle may be a frame division cycle Tdiv obtained by dividing the frame cycle T, and the inspection circuit may compare the voltage of the output signal SGO with the reference voltage VREF whose voltage changes in each frame division cycle Tdiv. Thus, when the given cycle of the reference voltage VREF is set to the frame division cycle Tdiv, a cycle of a signal waveform of the reference voltage VREF is shortened and an abnormal state of the voltage of the output signal SGO can be quickly detected as compared with the case in which the given cycle is set to the frame cycle T.

The electrostatic protection circuit 90 in FIG. 4 is an electro-static discharge (ESD) protection circuit. The electrostatic protection circuit 90 is provided between the driver circuit 31 and the output terminal TO. The electrostatic protection circuit 90 protects a circuit or an element provided inside the display driver 20 by discharging an electric charge due to static electricity to ground or a power supply when a surge voltage such as static electricity is applied to the output terminal TO. The electrostatic protection circuit 90 is implemented by, for example, an electrostatic protection element which is an ESD protection element. The electrostatic protection element is, for example, a diode for electrostatic protection or a resistor for electrostatic protection.

Figure 5:
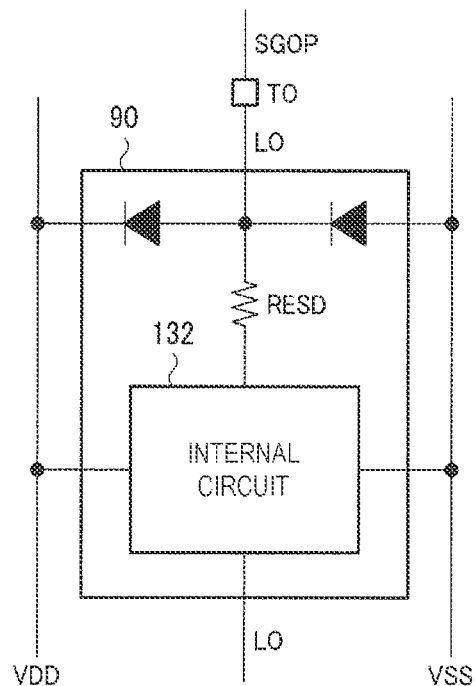
FIG. 5 is a configuration example of an electrostatic protection circuit according to the present embodiment.
Figure 6:
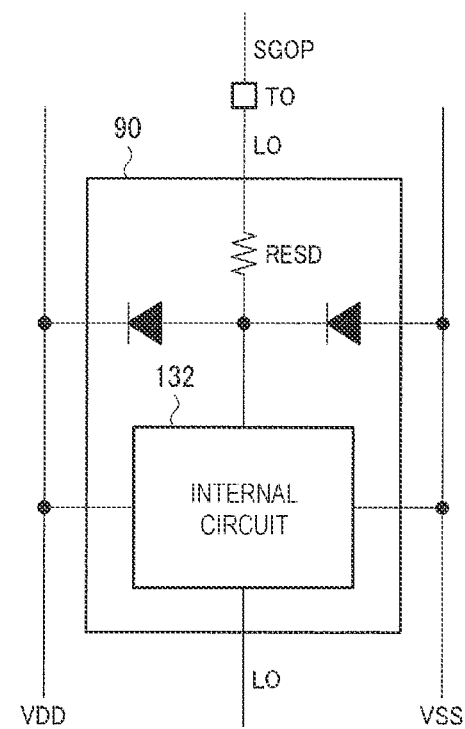
FIG. 6 is a configuration example of the electrostatic protection circuit according to the present embodiment.
Figure 7:
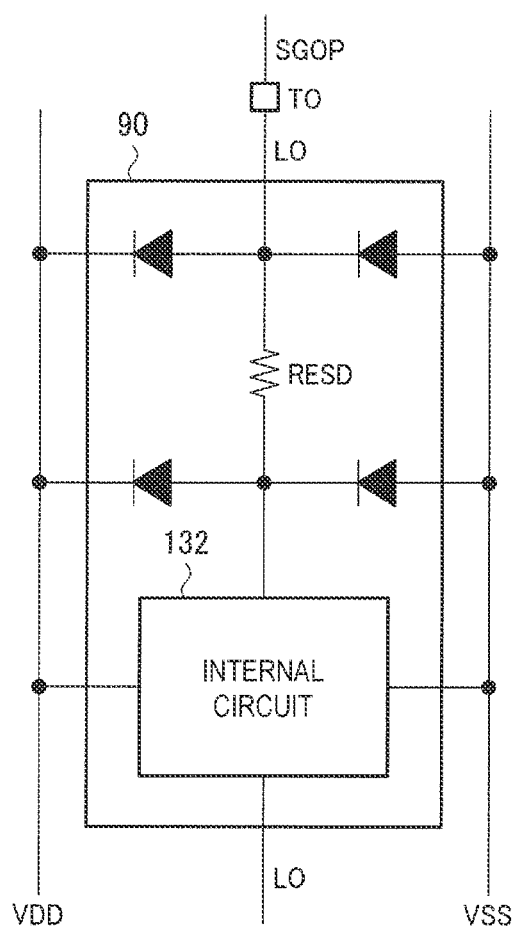
FIG. 7 is a configuration example of the electrostatic protection circuit according to the present embodiment.

FIGS. 5 to 7 show a specific configuration example of the electrostatic protection circuit 90. In a basic configuration of the electrostatic protection circuit 90, the output signal SGOP including noise due to the surge voltage or the like from the outside is input to an internal circuit 132 via a protection resistor RESD. Two PN diodes are coupled to one or both of a wiring between the output terminal TO and the protection resistor RESD and a wiring between the protection resistor RESD and the internal circuit 132, and an electric charge due to an overvoltage is discharged to the power supply or the ground. In the configuration in FIG. 5, the wiring coupling the output terminal TO and the protection resistor RESD is coupled to the power supply and the ground via the PN diodes. In the configuration in FIG. 6, the wiring coupling the protection resistor RESD and the internal circuit 132 is coupled to the power supply and the ground via the PN diodes. In the configuration in FIG. 7, the PN diode is coupled to each of the wiring coupling the output terminal TO and the protection resistor RESD and the wiring coupling the protection resistor RESD and the internal circuit 132.

As described above, the display driver 20 according to the present embodiment may include the electrostatic protection circuit 90 provided between the output line LO and the output terminal TO. Thus, when a surge voltage such as static electricity is applied to the output terminal TO, a circuit or an element provided inside the display driver 20 can be protected from a defect caused by the overvoltage by discharging the electric charge due to the static electricity to the ground or the power supply. The electrostatic protection circuit 90 of the display driver 20 according to the present embodiment may include the protection resistor RESD provided between the output line LO and the output terminal TO. Thus, even when a large surge voltage is applied to the output terminal TO, a circuit or the like provided inside the display driver 20 can be properly protected from the defect caused by the overvoltage.

The switch SW in FIG. 4 is provided between the comparison circuit 150 of the inspection circuit 41 and the output line LO coupling the driver circuit 31 and the electrostatic protection circuit 90. The switch SW is controlled to be turned on or off based on a signal from the control circuit 100. Specifically, when the switch is turned on, the voltage of the output signal SGO of the output line LO is input to the comparison circuit 150, and the voltage of the output signal SGO can be monitored in the comparison circuit 150. The switch SW can be implemented by a MOS transistor or the like.

Figure 8:
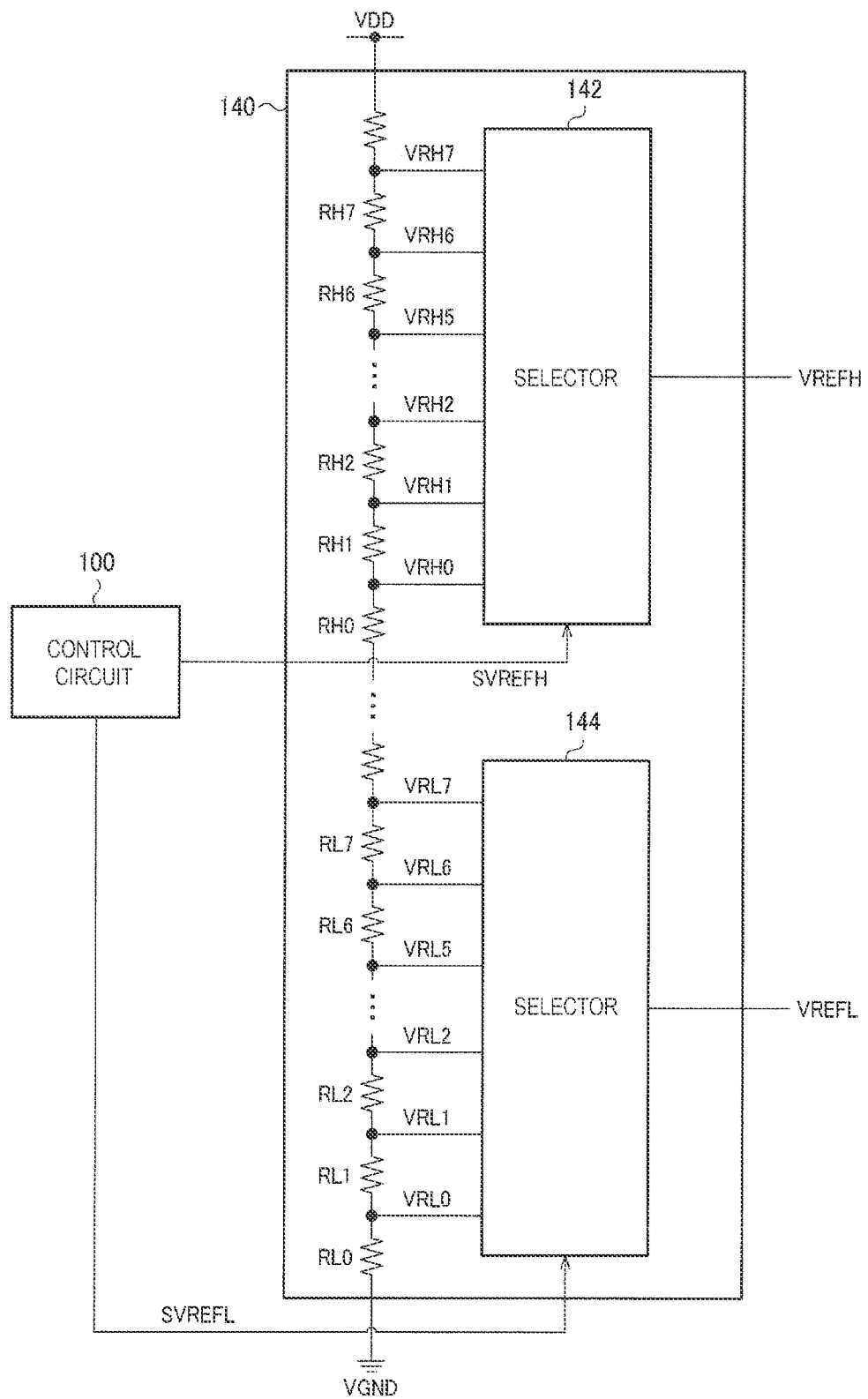
FIG. 8 is a configuration example of a reference voltage generation circuit according to the present embodiment.

The above-mentioned reference voltage generation circuit 140 will be described in detail. FIG. 8 shows a detailed configuration example of the reference voltage generation circuit 140. The reference voltage generation circuit 140 includes a selector 142, a selector 144, and resistors RH0 to RH7 and RL0 to RL7. Here, the reference voltage VREF includes a first reference voltage VREFH and a second reference voltage VREFL. When the inspection circuit 41 inspects an abnormality of the voltage of the output signal SGO, a reference voltage at the time of inspecting whether there is an abnormality in a high state of the signal waveform is the first reference voltage VREFH, and a reference voltage at the time of inspecting whether there is an abnormality in a low state is the second reference voltage VREFL. The control circuit 100 instructs the reference voltage generation circuit 140 which of a plurality of voltages is to be selected as the reference voltage VREF, and the reference voltage generation circuit 140 generates the first reference voltage VREFH and the second reference voltage VREFL based on the instruction. Specifically, the control circuit 100 transmits a signal SVREFH for setting the first reference voltage VREFH to the selector 142, and the selector 142 generates the first reference voltage VREFH based on the signal SVREFH. The control circuit 100 transmits a signal SVREFL for setting the second reference voltage VREFL to the selector 144, and the selector 144 generates the second reference voltage VREFL based on the signal SVREFL. The resistors RH0 to RH7 are provided in series between a ground voltage VGND and a power supply voltage VDD. In response to voltage drops in the resistors RH0 to RH7, voltages VRH0 to VRH7 and VRL0 to VRL7 are generated inside the reference voltage generation circuit 140. The voltages VRH0 to VRH7 are input to the selector 142, and the voltages VRL0 to VRL7 are input to the selector 144.

Figure 9:
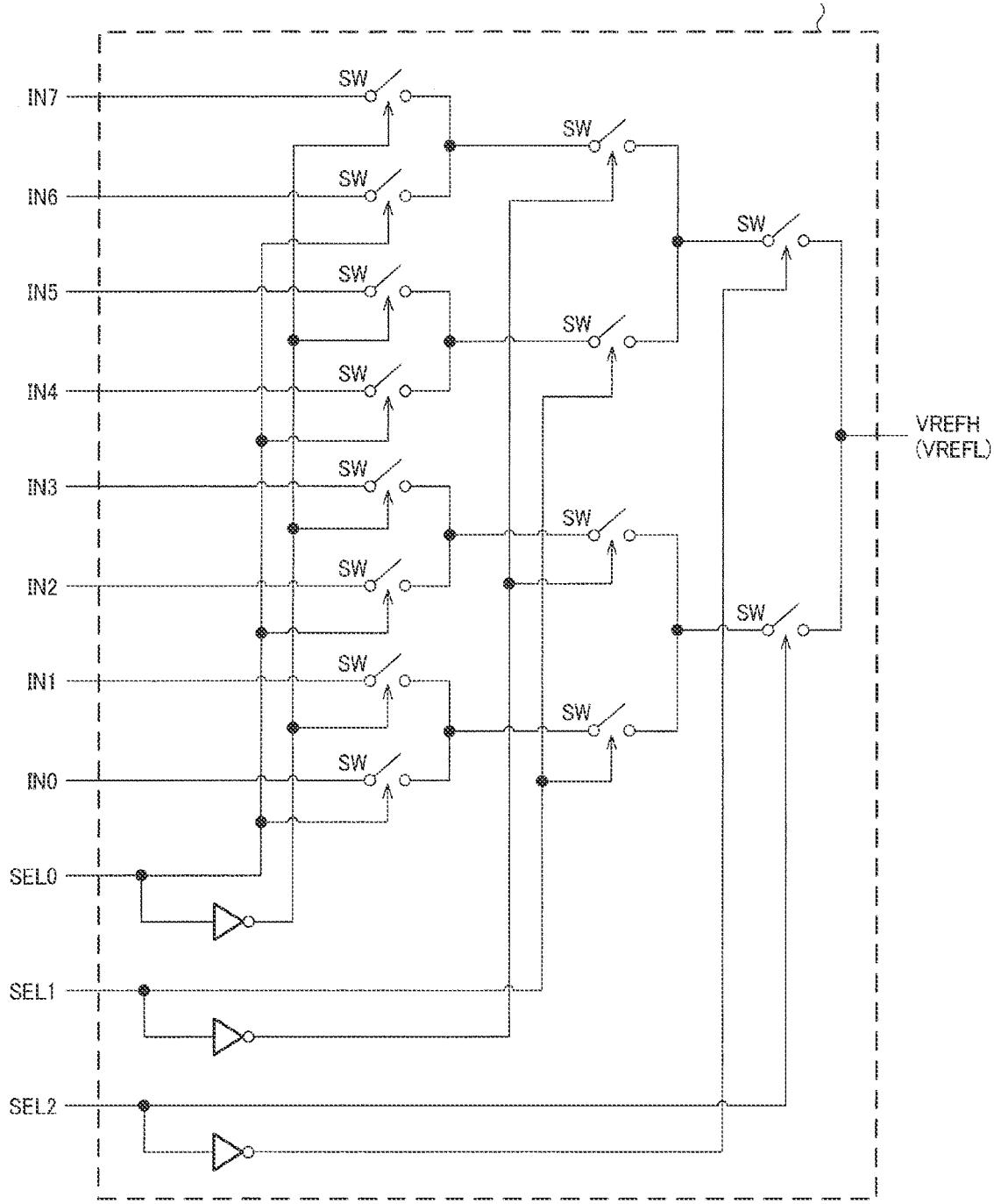
FIG. 9 is a configuration example of a selector of the reference voltage generation circuit according to the present embodiment.

FIG. 9 shows an internal configuration of the selectors 142 and 144 of the reference voltage generation circuit 140. The selectors 142 and 144 include inverters and a plurality of switches SWs. An input voltage signal IN0 is a voltage signal corresponding to the voltage VRH0 or the voltage VRL0. The same applies to input voltage signals IN1 to IN7. The selectors 142 and 144 can select any of the input voltage signals IN1 to IN7 based on the instruction of the control circuit 100 and output a voltage instructed by the control circuit 100. Thus, in the selector 142 and the selector 144, the first reference voltage VREFH and the second reference voltage VREFL are generated, and are output from the reference voltage generation circuit 140.

Figure 10:
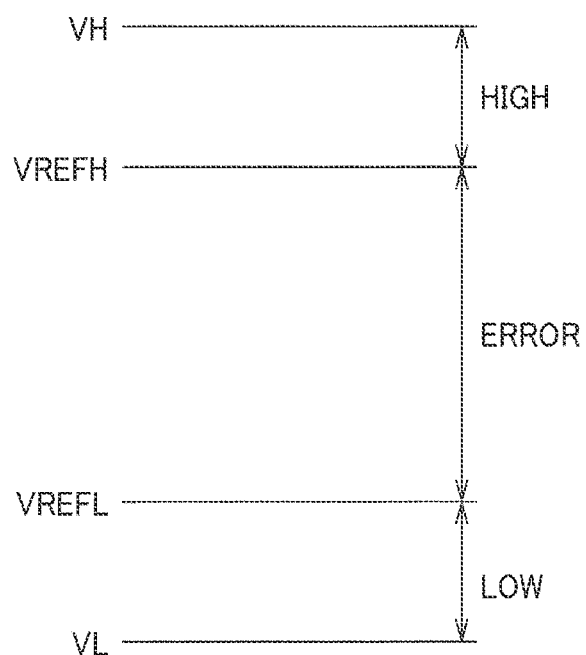
FIG. 10 is an example of a criterion for determining an abnormal state of a voltage of an output signal in a segment inspection circuit.

The comparison circuit 150 in FIG. 4 inspects the voltage of the output signal SGO of the driver circuit 31. Specifically, the comparison circuit 150 executes the inspection by comparing the voltage of the output signal SGO with the first reference voltage VREFH and the second reference voltage VREFL and executing determination. The comparison circuit 150 can be implemented by, for example, a comparator. FIG. 10 shows an example of a criterion for determining an abnormal state of a voltage of an output signal. The determination is executed by comparing the voltage of the output signal SGO with a first voltage VH, a second voltage VL, the first reference voltage VREFH, and the second reference voltage VREFL. Here, the first voltage VH is a voltage on a high potential side, and is, for example, the power supply voltage. The second voltage VL is a voltage on a low potential side, and is, for example, the ground voltage VGND. VH>VREFH>VREFL>VL. When the voltage of the output signal SGO is a voltage between the first reference voltage VREFH and the first voltage VH, the comparison circuit 150 determines that the voltage of the output signal SGO is in the high state. When the voltage of the output signal SGO is a voltage between the second voltage VL and the second reference voltage VREFL, the comparison circuit 150 determines that the voltage of the output signal SGO is in the low state. When the output voltage is a voltage between the first reference voltage VREFH and the second reference voltage VREFL, the comparison circuit 150 determines that an error occurs. The comparison circuit 150 outputs a determination result CQ to the level shifter 152.

The level shifter 152 shifts a level of an output signal of the comparison circuit 150. Specifically, the level shifter 152 outputs a signal having the same waveform as the determination result CQ from the comparison circuit 150 but having a different voltage value from the determination result CQ. For example, the level shifter 152 executes level conversion from a power supply voltage level of a high voltage to a power supply voltage level of a low voltage. Similarly to the level shifter 32, the level shifter 152 can include an inverter, a MOS transistor, a resistance element, and the like.

The determination circuit 160 determines whether the output signal SGO output from the driver circuit 31 is normally supplied to the segment electrode ES of the electro-optical panel 200 based on a segment monitor output signal SGMO output from the level shifter 152, and transmits a determination result SGDT to the control circuit 100.

As described above, in the display driver 20 according to the present embodiment, the inspection circuit 41 may include the reference voltage generation circuit 140 that generates a plurality of voltages and that outputs the reference voltage VREF selected from the plurality of voltages in each given cycle, and the comparison circuit 150 that compares the reference voltage VREF with the voltage of the output signal SGO. Thus, the abnormal state of the voltage of the output signal SGO of the driver circuit 31 can be reliably detected by comparing the voltage of the output signal SGO with the reference voltage VREF selected from a plurality of voltage levels in each given cycle in the comparison circuit 150.

The control circuit 100 of the display driver 20 according to the present embodiment may instruct the reference voltage generation circuit 140 which of the plurality of voltages is to be selected as the reference voltage VREF. Thus, when a change in the voltage of the output signal SGO of the driver circuit 31 is within a certain range, setting levels of the reference voltage VREF can be set in advance in the control circuit 100.

Figure 11:
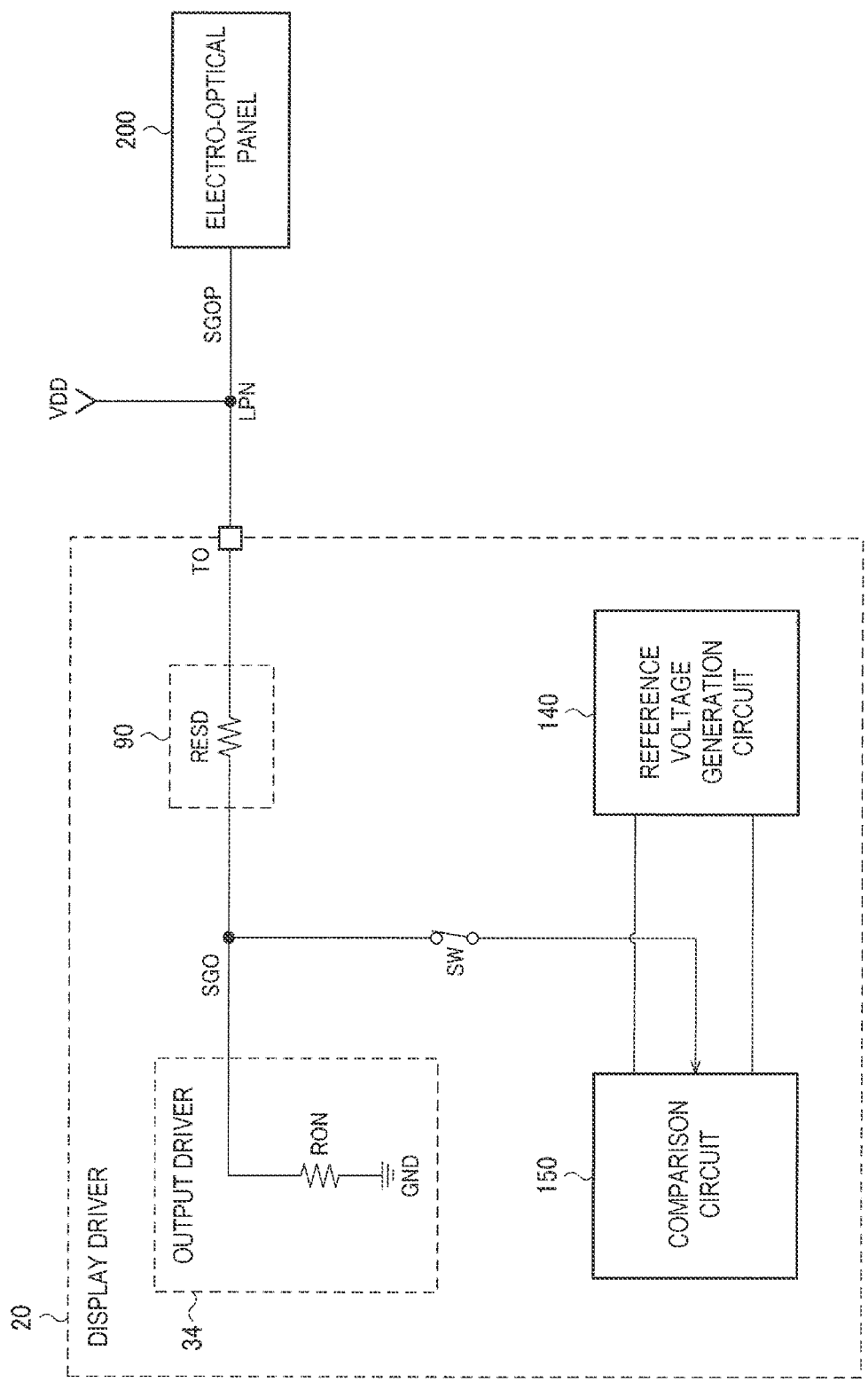
FIG. 11 is an equivalent circuit diagram in a case in which a panel signal line is short-circuited to a power supply voltage.

FIG. 11 is an equivalent circuit diagram of the display driver 20 in a case in which the panel signal line LPN is short-circuited to the power supply voltage VDD in a wiring between the output terminal TO and the segment electrode ES of the electro-optical panel 200, that is, in the panel signal line LPN. In FIG. 11, the N-type transistor constituting the output driver 34 is turned on, and the voltage of the output signal SGO is set to the ground voltage VGND. The output driver 34 can include the P-type transistor and the N-type transistor that are coupled in series between VDD and GND. The switch SW is turned on. In this case, since the panel signal line LPN is short-circuited to the power supply voltage VDD, the voltage of the output signal SGOP supplied to the electro-optical panel 200 is set to the power supply voltage VDD. Therefore, a voltage at a wiring node between an on-resistor RON and the protection resistor RESD is between the ground voltage VGND and the power supply voltage VDD, and is a voltage VDV1=(VDD−VGND)×RON/(RON+RESD) divided by the on-resistor RON of the N-type transistor of the output driver 34 and the protection resistor RESD. That is, in a period in which the N-type transistor of the output driver 34 is turned on and the voltage of the output signal SGO is originally set to the ground voltage VGND, the voltage of the output signal SGO increases to the divided voltage VDV1=(VDD−VGND)× RON/(RON+RESD) due to the occurrence of the short circuit.

Figure 12:
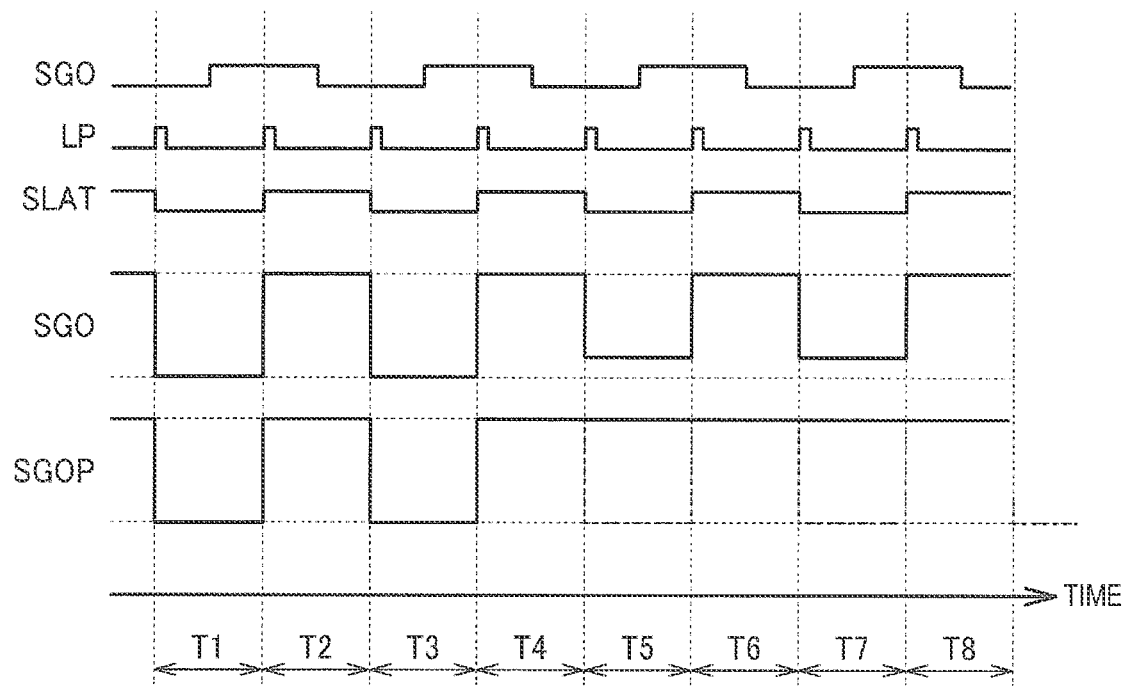
FIG. 12 is an example of waveforms of various signals in the case in which the panel signal line is short-circuited to the power supply voltage.

FIG. 12 is a signal waveform diagram showing waveforms of various signals in the case in which the panel signal line LPN is short-circuited to the power supply voltage VDD. The segment drive data SGD is shown in a rectangular waveform synchronized with a clock signal of a constant frequency controlled by the oscillation circuit 102. A latch pulse LP is a pulse signal for latching the segment drive data SGD in the middle of a high level period or a low level period of the segment drive data SGD. The segment signal SLAT is a signal obtained by latching the segment drive data SGD by the latch pulse LP. Here, as shown in FIG. 12, T1 is defined as a first frame period, T2 is defined as a second frame period, T3 is defined as a third frame period, . . . . Hereinafter, the same applies to FIGS. 13 to 22. The frame period is a period of a display frame of the electro-optical panel 200, and the latch pulse LP is a pulse signal having a high level in each frame period. FIG. 12 shows a case in which a short circuit between the panel signal line LPN and the power supply voltage VDD occurs at the beginning of a fifth frame period T5. After the fifth frame period T5 in which the short circuit occurs, a voltage of the panel signal line LPN is set to the power supply voltage VDD due to the short circuit. Therefore, as described above, in the fifth frame period T5 and the seventh frame period T7 in which the voltage of the output signal SGO of the output line LO is originally set to the ground voltage, the voltage of the output signal SGO is set to the divided voltage VDV1= (VDD−VGND)×RON/(RON+RESD).

Figure 13:
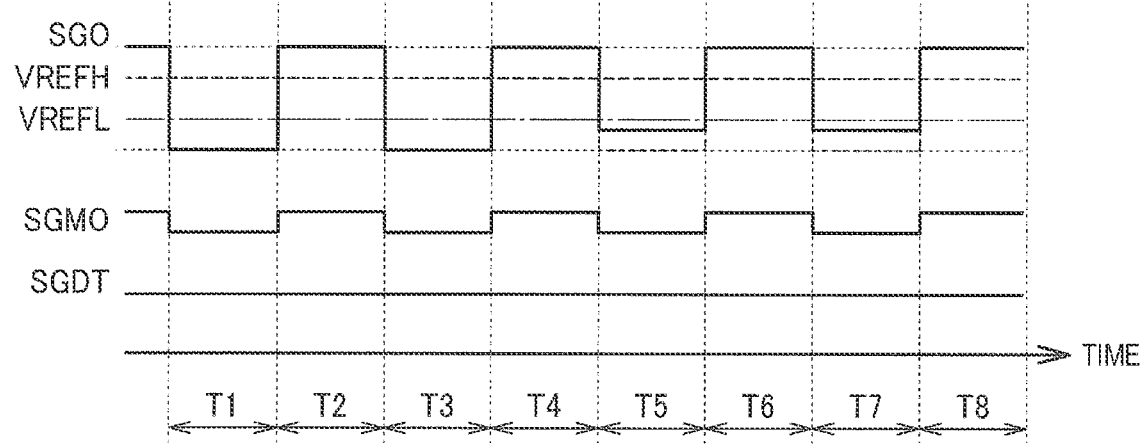
FIG. 13 is an example of waveforms of various signals when the abnormal state of the voltage is not properly determined in the case in which the panel signal line is short-circuited to the power supply voltage.
Figure 14:
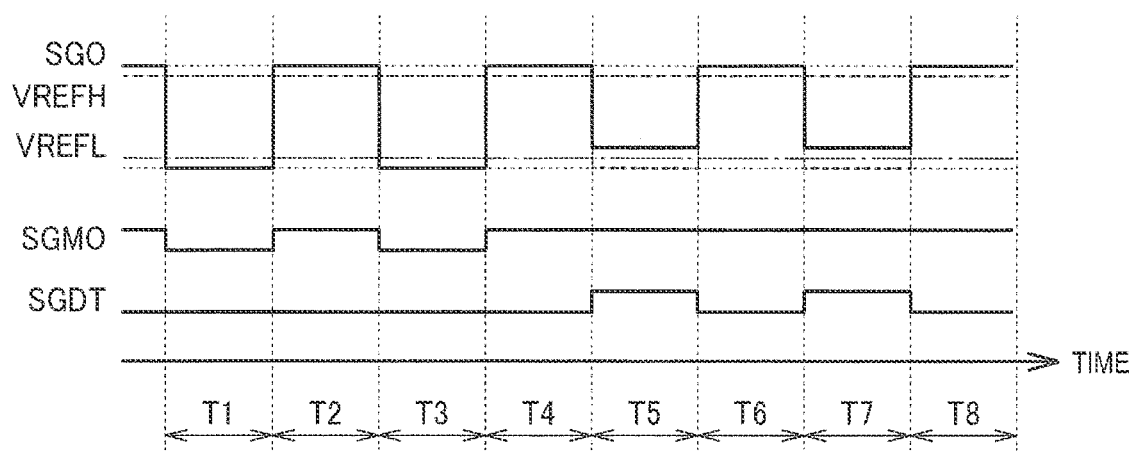
FIG. 14 is an example of waveforms of various signals when the abnormal state of the voltage is properly determined in the case in which the panel signal line is short-circuited to the power supply voltage.

FIG. 13 is a signal waveform diagram showing various signal waveforms in the comparison circuit 150 and the determination circuit 160 in the case in FIG. 12. The signal waveform diagram shown in an upper part of FIG. 13 is a signal waveform diagram displaying the output signal SGO input to the comparison circuit 150, the first reference voltage VREFH, and the second reference voltage VREFL in a superimposed manner. Here, the output signal SGO is indicated by a solid line, the first reference voltage VREFH is indicated by a broken line, and the second reference voltage VREFL is indicated by a one-dotted chain line. As described above, since the voltage of the output signal SGO is not lowered to the ground voltage VGND in the fifth frame period T5 and the seventh frame period T7 in which the divided voltage VDV1=(VDD−VGND)×RON/(RON+ RESD) is output according to the output signal SGO, the determination circuit 160 originally needs to determine that the voltage of the output signal SGO is abnormal. However, in the example in FIG. 13, the second reference voltage VREFL indicated by the one-dotted chain line is set to a voltage higher than the divided voltage VDV1, and the voltage of the output signal SGO in the fifth frame period T5 and the seventh frame period T7 is erroneously determined to be normal. FIG. 14 shows an example when voltage levels of the first reference voltage VREFH and the second reference voltage VREFL are different from each other as compared with the case in FIG. 13. That is, as compared with the case in FIG. 13, the first reference voltage VREFH is a voltage close to the first voltage VH, for example, the power supply voltage VDD, and the second reference voltage VREFL is a value close to the second voltage VL, for example, the ground voltage VGND. In this case, in the fifth frame period T5 and the seventh frame period T7 in which the erroneous determination is made in the case in FIG. 13, since the voltage of the output signal SGO is higher than the second reference voltage VREFL indicated by the one-dotted chain line, the output signal SGO is correctly determined to be in an abnormal state.

Figure 15:
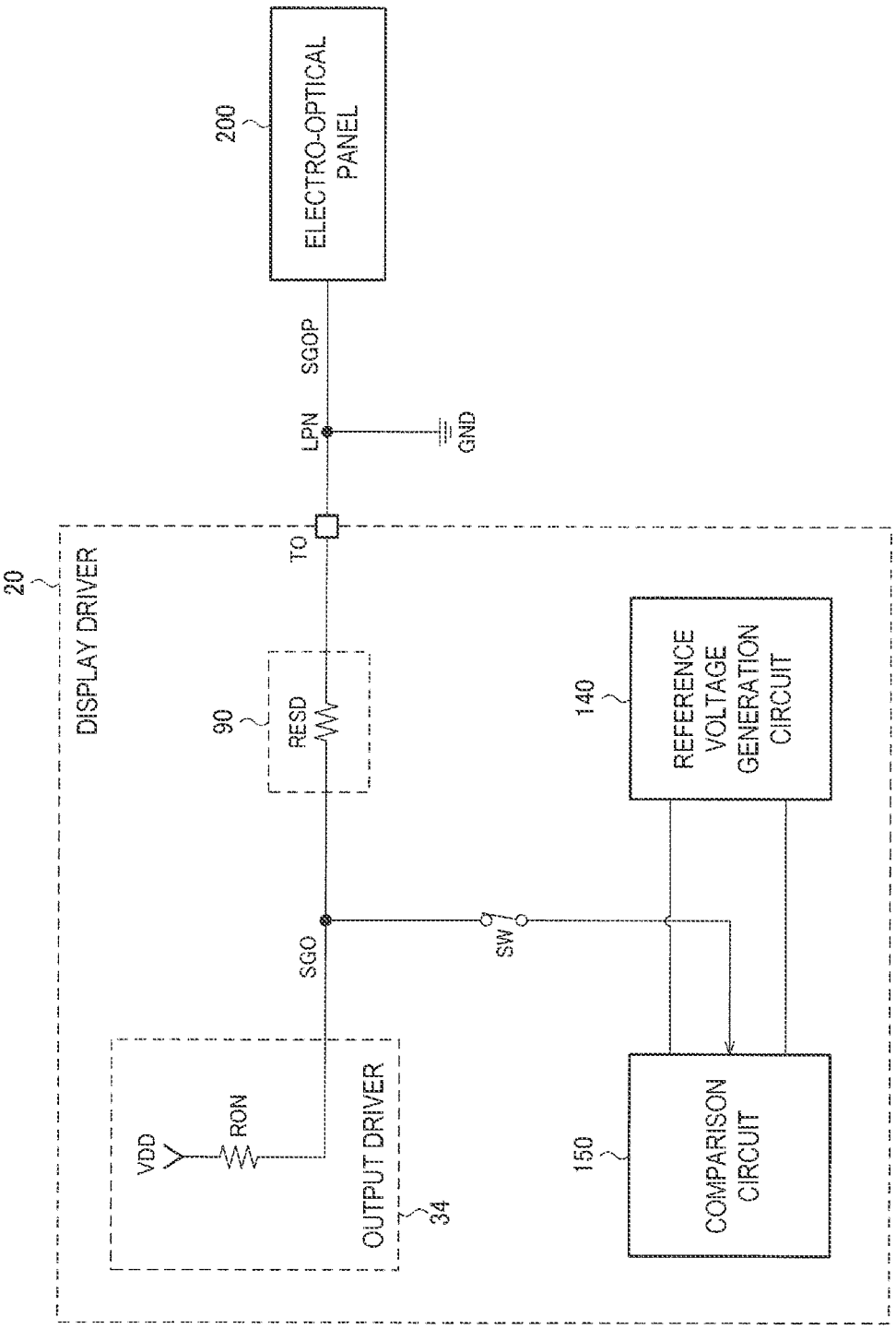
FIG. 15 is an equivalent circuit diagram in a case in which the panel signal line is short-circuited to ground.

FIG. 15 is an equivalent internal circuit diagram of the display driver 20 in the case in which the panel signal line LPN is short-circuited to the ground voltage VGND in the wiring between the output terminal TO and the segment electrode ES of the electro-optical panel 200, that is, in the panel signal line LPN. In FIG. 15, the P-type transistor constituting the output driver 34 is turned on, and the voltage of the output signal SGO is set to the power supply voltage VDD. The switch SW is turned on. In this case, since the panel signal line LPN is short-circuited to the ground voltage VGND, the voltage of the output signal SGOP supplied to the electro-optical panel 200 is set to the ground voltage VGND. Therefore, the voltage of the output signal SGO at the wiring node between the on-resistor RON and the protection resistor RESD is between the ground voltage VGND and the power supply voltage VDD, and is a voltage VDV2=(VDD−VGND)×RESD/(RON+RESD) divided by the on-resistor RON of the P-type transistor of the output driver 34 and the protection resistor RESD of the electrostatic protection circuit 90. That is, in a period in which the P-type transistor of the output driver 34 is turned on and the output signal SGO is originally set to the power supply voltage VDD, the output signal SGO decreases to the divided voltage VDV2=(VDD−VGND)×RESD/(RON+RESD) due to the occurrence of the short circuit.

Figure 16:
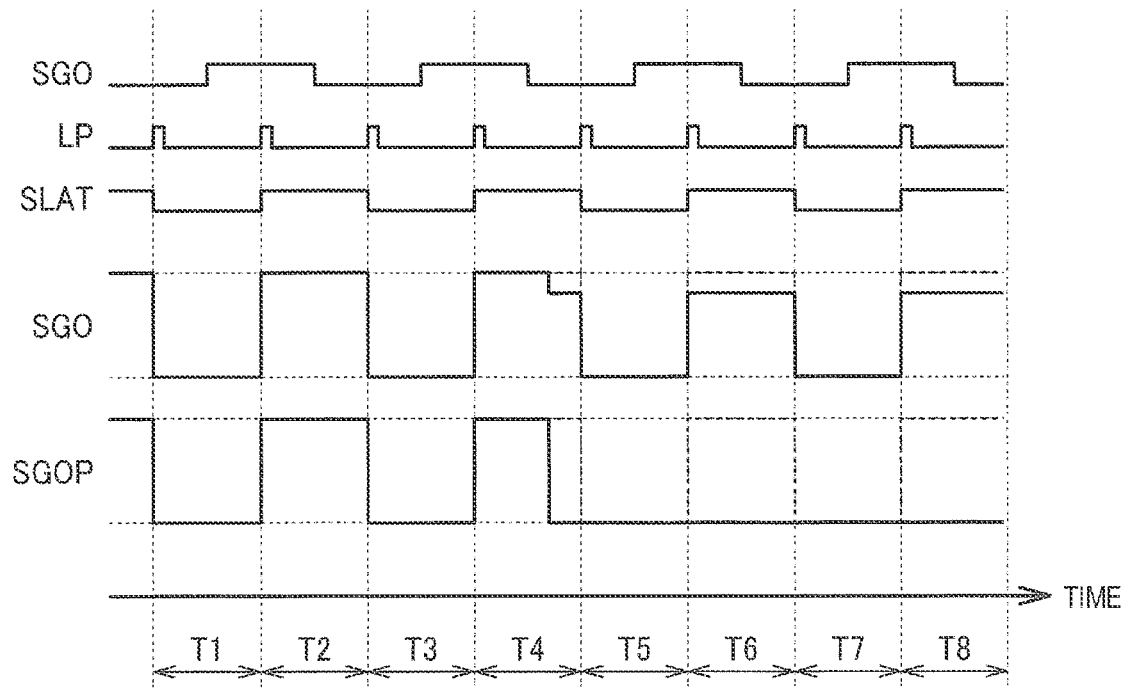
FIG. 16 is an example of waveforms of various signals in the case in which the panel signal line is short-circuited to the ground.

FIG. 16 is a signal waveform diagram showing waveforms of various signals in the case in which the panel signal line LPN is short-circuited to the ground voltage VGND. The segment drive data SGD, the latch pulse LP, and the segment signal SLAT are as described with reference to FIG. 12. FIG. 16 shows a case in which the short circuit occurs in the middle of a fourth frame period T4. In FIG. 16, due to the short circuit, the voltage of the panel signal line LPN is set to the ground voltage VGND from the middle of the fourth frame period T4. Therefore, as described above, in the fourth frame period T4, a sixth frame period T6, and an eighth frame period T8 in which the voltage of the output signal SGO is originally set to the power supply voltage VDD, the voltage of the output signal SGO is set to the divided voltage VDV2=(VDD−VGND)×RESD/(RON+RESD) divided by the on-resistor RON of the output driver 34 and the protection resistor RESD of the electrostatic protection circuit 90.

Figure 17:
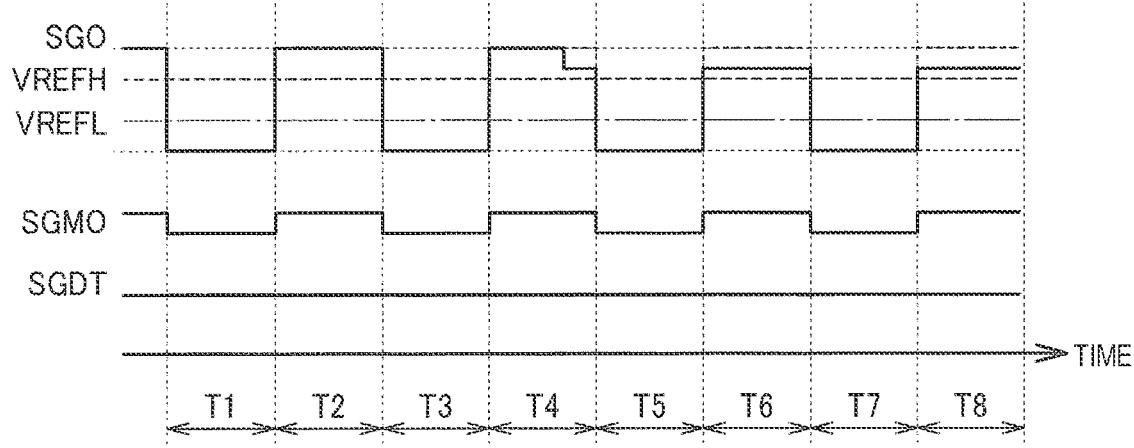
FIG. 17 is an example of waveforms of various signals when the abnormal state of the voltage is not properly determined in the case in which the panel signal line is short-circuited to the ground.
Figure 18:
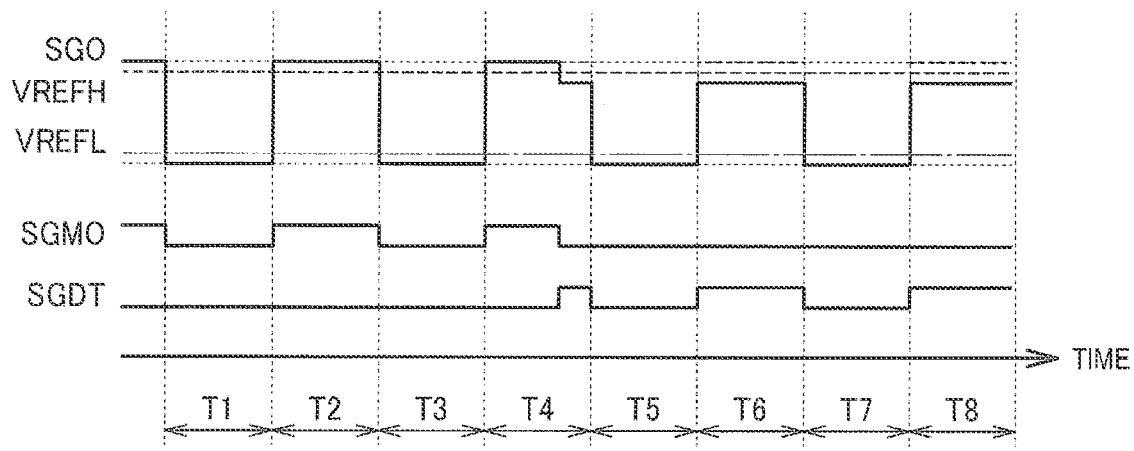
FIG. 18 is an example of waveforms of various signals when the abnormal state of the voltage is properly determined in the case in which the panel signal line is short-circuited to the ground.

FIG. 17 is a signal waveform diagram showing various signal waveforms in the comparison circuit 150 and the determination circuit 160 in the case in FIG. 16. The signal waveform diagram shown in an upper part of FIG. 17 shows the output signal SGO input to the comparison circuit 150, the first reference voltage VREFH, and the second reference voltage VREFL in a superimposed manner. Here, similarly to FIGS. 13 and 14, in FIGS. 17 and 18, the output signal SGO is indicated by a solid line, the first reference voltage VREFH is indicated by a broken line, and the second reference voltage VREFL is indicated by a one-dotted chain line. As described above, in the fourth frame period 14 and the seventh frame period T7 in which the output signal SGO does not normally output the power supply voltage VDD, the determination circuit 160 originally needs to determine that the voltage of the output signal SGO is abnormal. However, in the example in FIG. 17, since the first reference voltage VREFH indicated by the one-dotted chain line is set to a voltage level lower than the above-described divided voltage VDV2=(VDD−VGND)×RESD/(RON+RESD), the output signal SGO is erroneously determined to be normal in the fourth frame period T4, the sixth frame period T6, and the eighth frame period T8. On the other hand, FIG. 18 shows an example in which the setting of voltage levels of the first reference voltage VREFH and the second reference voltage VREFL is changed as compared with the case in FIG. 17. That is, the first reference voltage VREFH in FIG. 18 is set to a voltage higher than that in the case in FIG. 17, and the second reference voltage VREFL in FIG. 18 is set to a voltage lower than that in the case in FIG. 17. In this case, in the fourth frame period 14, the sixth frame period T6, and the eighth frame period T8 in which the output signal SGO is erroneously determined to be normal in FIG. 17, in FIG. 18, the voltage of the output signal SGO is set to a voltage lower than the first reference voltage VREFH indicated by the broken line, and the output signal SGO is correctly determined to be abnormal. Thus, by changing setting voltages of the first reference voltage VREFH and the second reference voltage VREFL, the inspection circuit 41 can correctly determine an abnormal state of the output signal SGO even when the output signal SGO changes from an original signal waveform due to the short circuit. Specifically, by setting the first reference voltage VREFH to a voltage lower than the first voltage VH and setting the second reference voltage VREFL to a voltage higher than the second voltage VL, an abnormal state can be reliably detected even when the output signal SGO deviates from an original rectangular signal waveform.

Figure 19:
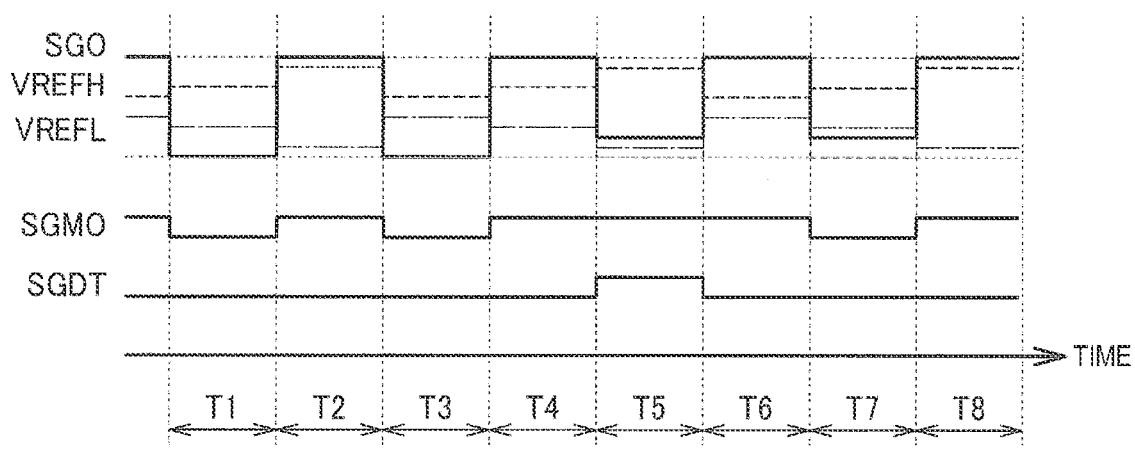
FIG. 19 is a first signal waveform example of a reference voltage according to the present embodiment in the case in which the panel signal line is short-circuited to the power supply voltage.

FIG. 19 shows waveforms of various signals when the voltage levels of the first reference voltage VREFH and the second reference voltage VREFL are each temporally changed in the case in FIG. 12, that is, in the case in which the panel signal line LPN is short-circuited to the power supply voltage VDD. Specifically, the first reference voltage VREFH changes in each frame cycle T and changes to a voltage level of three levels. Similarly, the second reference voltage VREFL changes in each frame cycle T and changes to a voltage level of three levels.

In FIG. 19, the second reference voltage VREFL indicated by the one-dotted chain line changes to a voltage lower than the second reference voltage VREFL in the first frame period T1 when the frame period changes from the first frame period T1 to the second frame period T2. Thereafter, when the frame period changes from the second frame period T2 to the third frame period T3, the second reference voltage VREFL changes to a voltage higher than the second reference voltage VREFL in the first frame period T1. Similarly, after the fourth frame period T4, the second reference voltage VREFL changes in each frame cycle T. Here, in the fifth frame period T5 in which the short circuit occurs between the panel signal line LPN and the power supply voltage VDD, since the second reference voltage VREFL is set to a voltage lower than the divided voltage VDV1=(VDD−VGND)×RON/(RON+RESD) which is the voltage of the output signal SGO, an abnormal state of the voltage of the output signal SGO can be properly detected. That is, with reference to FIGS. 17 and 18, it has been described that when the voltages of the first reference voltage VREFH and the second reference voltage VREFL are set to be constant, respectively, in a case in which the voltage level of the second reference voltage VREFL is not appropriate, the abnormal state of the output signal SGO due to the short circuit of the panel signal line LPN may not be properly detected. However, by changing the reference voltage VREF in each frame cycle T as shown in FIG. 19, the abnormal state can be detected. In the following description, the first reference voltage VREFH and the second reference voltage VREFL are collectively referred to as the reference voltage VREF as appropriate.

Figure 20:
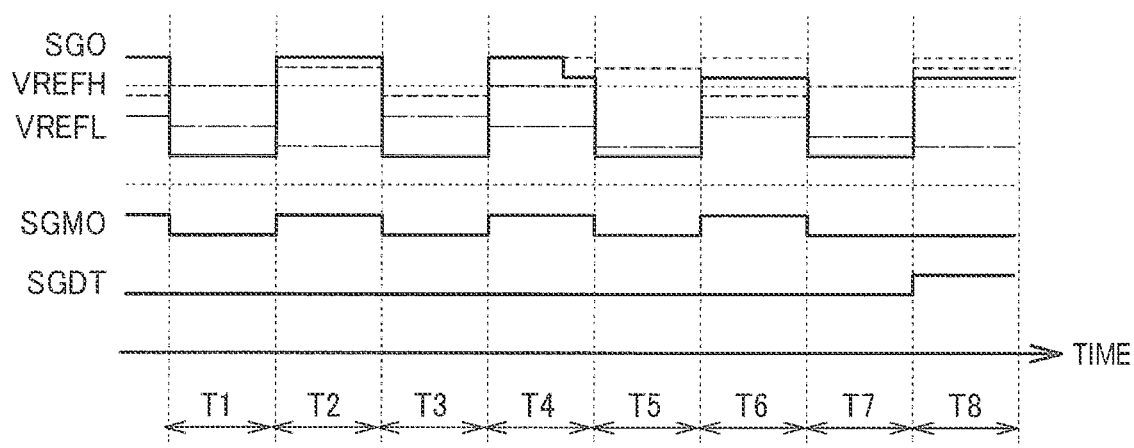
FIG. 20 is a first signal waveform example of a reference voltage according to the present embodiment in the case in which the panel signal line is short-circuited to the ground.

FIG. 20 is a signal waveform diagram showing that the reference voltage VREF changes in each frame cycle T as in FIG. 19 in the case in FIG. 16, that is, in the case in which the panel signal line LPN is short-circuited to the ground voltage VGND. As described above, due to the short circuit, the voltage in the high state of the output signal SGO is set to a voltage lower than the power supply voltage VDD from the middle of the fourth frame period 14. Here, since the first reference voltage VREFH indicated by the broken line is set to a voltage lower than the divided voltage VDV2=(VDD−VGND)×RESD/(RON+RESD) which is the voltage of the output signal SGO in the fourth frame period 14, and the output signal SGO is determined to be in the high state, the abnormal state of the voltage of the output signal SGO cannot be detected. Also in the sixth frame period T6, since the first reference voltage VREFH is set to a voltage lower than that in the fourth frame period 14, the abnormal state of the voltage of the output signal SGO cannot be detected. However, in the eighth frame period T8, the first reference voltage VREFH is set to a voltage higher than the divided voltage VDV2 which is the voltage of the output signal SGO, and it is possible to detect that the voltage of the output signal SGO is in an abnormal state. For example, when the abnormal state of the output signal SGO is not properly determined in a case in which the reference voltage VREF of a constant voltage is set, resistance values of the on-resistor RON of the output driver 34 and the protection resistor RESD of the electrostatic protection circuit 90 described above may vary, and the divided voltages VDV1 and VDV2 which are the voltages of the output signal SGO described above may vary. Here, the resistance values of the on-resistor RON and the protection resistor RESD vary depending on variations in manufacturing process, temperature, and the like. The resistance value of the on-resistor RON varies depending on a gate voltage. Therefore, it is not easy to predict the divided voltages VDV1 and VDV2 in the output signal SGO in advance and set the reference voltage VREF when the short circuit occurs. However, when the reference voltage VREF changes in each frame cycle T as described above, the abnormal state of the output signal SGO can be reliably detected even when the divided voltages VDV1 and VDV2 which are the voltages of the output signal SGO change. According to the method described with reference to FIGS. 19 and 20, since the reference voltage may be changed in synchronization with the frame cycle T, control of changing the reference voltage is facilitated. For example, since the control circuit may give an instruction to change the reference voltage VREF in synchronization with the latch pulse LP, the reference voltage can be easily controlled. In FIGS. 19 and 20, a case has been described as an example in which the reference voltage VREF changes to three different voltage levels, but the number of the setting levels of the voltage level of the reference voltage VREF is not limited thereto. That is, when the number of the setting levels of the voltage level of the reference voltage VREF is M, the reference voltage VREF returns to an initial voltage level of the reference voltage VREF after the period of T×M has elapsed. Here, when the number M of the setting levels of the voltage level is increased, an abnormality of the voltage can be detected even for a slight change in the voltage of the output signal SGO.

Figure 21:
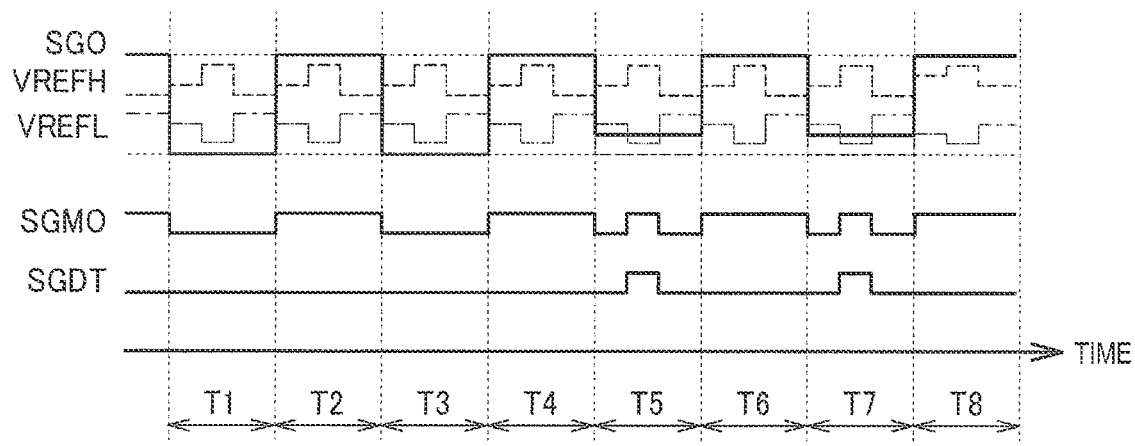
FIG. 21 is a second signal waveform example of the reference voltage according to the present embodiment in the case in which the panel signal line is short-circuited to the power supply voltage.
Figure 22:
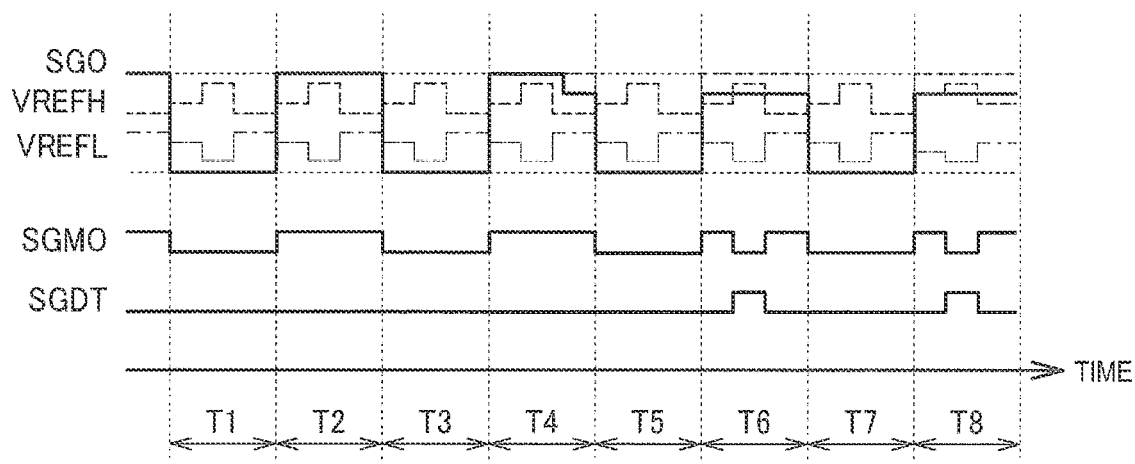
FIG. 22 is a second signal waveform example of the reference voltage according to the present embodiment in the case in which the panel signal line is short-circuited to the ground.

FIGS. 21 and 22 show examples of signal waveforms of the reference voltage VREF different from the signal waveforms of the reference voltage VREF shown in FIGS. 19 and 20. Specifically, the difference is that the voltage level of the reference voltage VREF changes in each frame cycle T in FIGS. 19 and 20, whereas the voltage level of the reference voltage VREF changes in each frame division cycle Tdiv obtained by dividing the frame cycle T into three in FIGS. 21 and 22. Thus, when the given cycle is set to the frame cycle T, the reference voltage VREF returns to the initial voltage level of the reference voltage VREF after the period of T×M has elapsed, but the reference voltage VREF returns to the initial voltage level of the reference voltage VREF after a frame period has elapsed. Therefore, the abnormal state of the voltage of the output signal SGO can be quickly detected. In FIG. 21 and FIG. 22, the setting level of the voltage level of the reference voltage VREF is not limited to three levels, which is the same as the case in FIGS. 19 and 20.

Here, as a method for setting the reference voltage VREF, a method for setting the reference voltage VREF from the above-mentioned external processing device 120 is provided. Hereinafter, the method for setting the reference voltage VREF from the external processing device 120 will be described. When the reference voltage VREF is set according to this method, the display driver 20 includes, for example, a command setting register 112. The command setting register 112 stores command setting information input to the processing device 120. The command setting register 112 can be implemented by, for example, a flip-flop circuit or a memory such as a RAM. The information input to the processing device 120 is input to the interface circuit 110, and the command setting information is written from the interface circuit 110 to the command setting register 112. The control circuit 100 outputs information such as a voltage set as the reference voltage VREF to the reference voltage generation circuit 140 based on the information.

FIGS. 23 and 24 illustrate a command and a value of the reference voltage VREF corresponding to the command. A first command in FIG. 23 is a command for setting a voltage level of the first reference voltage VREFH. In the case in FIG. 23, a value from 0 to 5 is set according to the first command, and the first reference voltage VREFH can be set to any voltage of 0.70 V, 0.75 V, 0.80 V, 0.85 V, 0.90 V, and 0.95 V corresponding to the set value. A second command in FIG. 24 is a command for setting a voltage level of the second reference voltage VREFL. In the case in FIG. 24, a value from 0 to 5 is set according to the second command, and the second reference voltage VREFL can be set to any voltage of 0.05 V, 0.10 V, 0.15 V, 0.20 V, 0.25 V, and 0.30 V corresponding to the set value.

That is, the display driver 20 may include the command setting register 112 in which a command is set from the external processing device 120, and the control circuit 100 may instruct the reference voltage generation circuit 140 which of the plurality of voltages is to be selected as the reference voltage VREF based on command setting of the command setting register 112. Thus, it is possible to easily cope with a case in which, for example, the divided voltages VDV1 and VDV2 serving as the voltages of the output signal SGO vary due to various factors such as process variation, and the reference voltage VREF to be compared need to be individually set.

In FIGS. 23 and 24, the processing device 120 may set a command in the command setting register in each given cycle. For example, with reference to FIGS. 19 to 22, it has been described that a short circuit between the output terminal TO and the segment electrode ES of the electro-optical panel 200 can be reliably detected by changing the reference voltage VREF in each given cycle. However, the setting of the reference voltage VREF can be changed by the external processing device 120. That is, in the display driver 20 according to the present embodiment, the control circuit 100 may instruct the reference voltage generation circuit 140 which of the plurality of voltages is to be selected as the reference voltage VREF based on the command setting set in the command setting register 112 from the processing device 120 in each given cycle. Thus, when the short circuit as described with reference to FIGS. 11 and 15 occurs, as the reference voltage VREF for determining whether the voltage of the output signal SGO is in the abnormal state, the control circuit 100 can instruct the reference voltage generation circuit 140 which of the plurality of voltages is to be selected in each given cycle.

Although the above description has been made on the assumption of a static driving method, the display driver 20 according to the present embodiment is not limited thereto, and can be applied to a driving method of duty driving. In the case of the driving method of duty driving, a time-divided segment drive signal is input to each of the segment electrodes ESS1 to ESS7 within the frame period. That is, a voltage synchronized with the latch pulse is supplied to each of the segment electrodes ESS1 to ESS7, and display of a numeral or a predetermined symbol is controlled.

3. Display Module

Figure 25:
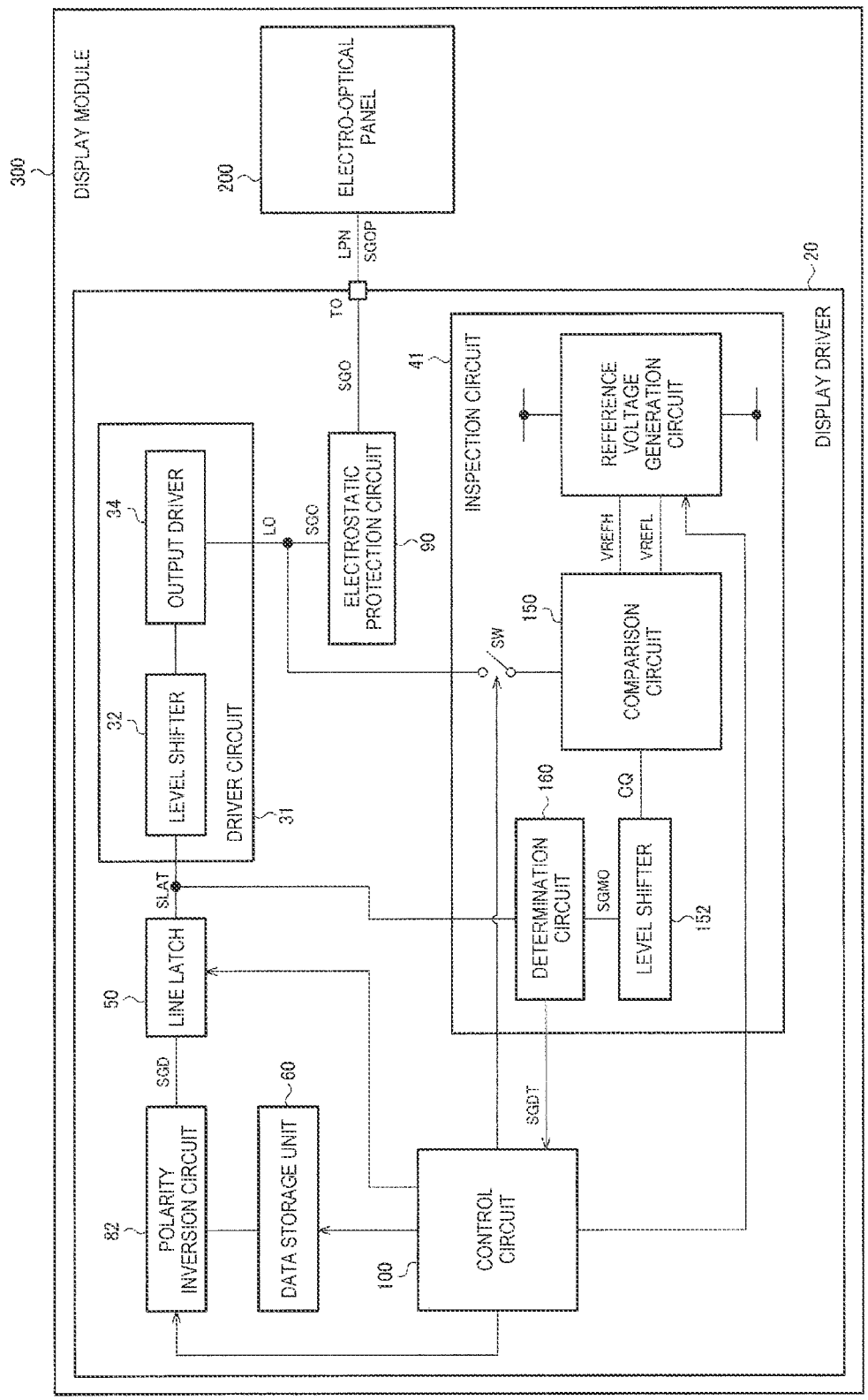
FIG. 25 is a configuration example of a display module according to the present embodiment.

FIG. 25 is a configuration example of a display module 300 according to the present embodiment. The display module 300 includes the display driver 20 and the electro-optical panel 200. The display driver 20 has the same configuration as the display driver 20 described with reference to FIGS. 1 and 4. The electro-optical panel 200 also has the same configuration as the electro-optical panel 200 described with reference to FIGS. 2 and 3. The display module 300 can be assumed to be applied to, for example, a wristwatch, a wearable device, a biological information measurement device, a portable information terminal such as a smartphone and a mobile phone, a cordless telephone device, a shaver, an electric toothbrush, a handy terminal, and an automobile.

According to the present embodiment, since the display module 300 can be applied to various electronic apparatuses and a reference voltage can be changed in each given cycle even when a defect occurs in the display of the electro-optical panel 200, an abnormal state can be reliably detected according to the voltage of the output signal SGO of the driver circuit.

As described above, a display driver according to the present embodiment relates to a display driver including: a driver circuit that drives an electro-optical panel; an output terminal that outputs an output signal from the driver circuit; an output line that couples the output of the driver circuit and the output terminal; and an inspection circuit that detects an abnormality of the output signal output by the driver circuit to the output line by monitoring a voltage of the output signal. The inspection circuit determines whether the voltage of the output signal is abnormal by comparing the voltage of the output signal with a reference voltage whose voltage changes in each given cycle.

According to the present embodiment, since the reference voltage can be changed in a reference voltage generation circuit in each given cycle, an abnormal state can be properly detected even when a change in the voltage of the output signal of the driver circuit is not constant.

In the present embodiment, the given cycle may be a frame cycle, and the inspection circuit may compare the voltage of the output signal with the reference voltage whose voltage changes in each frame cycle.

Thus, since the reference voltage may be changed in synchronization with the frame cycle, the control of changing the reference voltage is facilitated.

In the present embodiment, the given cycle may be a frame division cycle obtained by dividing the frame cycle, and the inspection circuit may compare the voltage of the output signal with the reference voltage whose voltage changes in each frame division cycle.

Thus, the cycle of the signal waveform of the reference voltage is shortened and an abnormal state of the voltage of the output signal of the driver circuit can be quickly detected as compared with the case in which the given cycle is set to the frame cycle.

In the present embodiment, the display driver may include an electrostatic protection circuit provided between the output line and the output terminal.

Thus, when the surge voltage such as static electricity is applied to the output terminal, a circuit or an element provided inside the display driver can be protected from a defect caused by the overvoltage by discharging the electric charge due to the static electricity to the ground or the power supply.

In the present embodiment, the electrostatic protection circuit of the display driver may include a protection resistor provided between the output line and the output terminal.

Thus, even when a large surge voltage is applied to the output terminal, the circuit or the element provided inside the display driver can be properly protected from the defect caused by the overvoltage.

In the present embodiment, the inspection circuit may include the reference voltage generation circuit that generates a plurality of voltages and that outputs the reference voltage selected from the plurality of voltages in each given cycle, and a comparison circuit that compares the reference voltage with the voltage of the output signal.

Thus, a reference voltage can be generated with which the voltage of the output signal of the driver circuit can be properly determined, and an abnormal state of the voltage of the output signal can be reliably detected within a period of a certain cycle.

In the present embodiment, the display driver may include the control circuit, and the control circuit may instruct the reference voltage generation circuit which of the plurality of voltages is to be selected as the reference voltage.

Thus, when the change in the voltage of the output signal of the driver circuit is within a certain range, voltage levels of the reference voltage can be set in advance in the control circuit.

In the present embodiment, the display driver may include a command setting register in which a command is set from an external processing device, and the control circuit may instruct the reference voltage generation circuit which of the plurality of voltages is to be selected as the reference voltage based on command setting of the command setting register.

Thus, it is possible to set an appropriate reference voltage according to factors such as process variation from the outside of the electro-optical panel 200 for the abnormal state of the voltage of the output signal of the driver circuit, and it is possible to determine the abnormal state based on the reference voltage.

In the present embodiment, the control circuit of the display driver may instruct the reference voltage generation circuit which of the plurality of voltages is to be selected as the reference voltage based on the command setting set in the command setting register from the processing device in each given cycle.

Thus, the abnormal state of the voltage of the output signal of the driver circuit can be determined based on an appropriate reference voltage in each given cycle.

A display module according to the present embodiment relates to a display module including the display driver and the electro-optical panel. The display driver includes the driver circuit that drives the electro-optical panel; the output terminal that outputs an output signal from the driver circuit; the output line that couples the output of the driver circuit and the output terminal; and the inspection circuit that detects an abnormality of the output signal output by the driver circuit to the output line by monitoring the voltage of the output signal. The inspection circuit determines whether the voltage of the output signal is abnormal by comparing the voltage of the output signal with the reference voltage whose voltage changes in each given cycle.

According to the present embodiment, since the display module can be applied to various electronic apparatuses and the reference voltage can be changed in each given cycle even when a defect occurs in the display of the electro-optical panel, an abnormal state can be reliably detected according to the voltage of the output signal of the driver circuit.

Although the present embodiment has been described in detail above, it will be easily understood by those skilled in the art that a plurality of modifications can be made without substantially departing from the novel matters and effects according to the present disclosure. Therefore, all such modifications are intended to be included within the scope of the present disclosure. For example, a term cited with a different term having a broader meaning or the same meaning at least once in the description or in the drawings can be replaced with the different term in any place in the description or in the drawings. All combinations of the present embodiment and the modifications are also included in the scope of the present disclosure. The configurations, operations, and the like of the display driver, the display module, and the like are not limited to those described in the present embodiment, and various modifications can be made.

What is claimed is:

1. A display driver comprising:
   a driver circuit that drives an electro-optical panel;
   an output terminal that outputs an output signal from the driver circuit;
   an output line that couples the output of the driver circuit and the output terminal; and
   an inspection circuit that detects an abnormality of the output signal output by the driver circuit to the output line by monitoring a voltage of the output signal, wherein
   the inspection circuit determines whether the voltage of the output signal is abnormal by comparing the voltage of the output signal with a first reference voltage and a second reference voltage in each given cycle,
   a value of the first reference voltage is higher than a value of the second reference voltage, and
   the inspection circuit includes:
      a reference voltage generation circuit that generates a plurality of voltages and that outputs the first and second reference voltages selected from the plurality of voltages in each given cycle; and
      a comparison circuit that:
         compares whether the voltage of the output signal is between the first and second reference voltages;
         determines that the voltage of the output signal is abnormal when the voltage of the output signal is between the first and second reference voltages;
         determines that the voltage of the output signal is normal when the voltage of the output signal deviates from a range between the first and second reference voltages; and
         provides abnormality information including a comparison result to a control circuit that controls the display driver.

2. The display driver according to claim 1, wherein
   the given cycle is a frame cycle, and
   the inspection circuit compares the voltage of the output signal with the first and second reference voltages whose voltages change in each frame cycle.

3. The display driver according to claim 1, wherein
   the given cycle is a frame division cycle obtained by dividing a frame cycle, and
   the inspection circuit compares the voltage of the output signal with the first and second reference voltages whose voltages change in each frame division cycle.

4. The display driver according to claim 1, further comprising
   an electrostatic protection circuit provided between the output line and the output terminal.

5. The display driver according to claim 4, wherein
   the electrostatic protection circuit includes a protection resistor provided between the output line and the output terminal.

6. The display driver according to claim 1, further comprising
   the control circuit, wherein
   the control circuit instructs the reference voltage generation circuit which of the plurality of voltages is to be selected as one of the first and second reference voltages.

7. The display driver according to claim 6, further comprising
   a command setting register in which a command is set from an external processing device, wherein
   the control circuit instructs the reference voltage generation circuit which of the plurality of voltages is to be selected as one of the first and second reference voltages based on command setting of the command setting register.

8. The display driver according to claim 7, wherein
   the control circuit instructs the reference voltage generation circuit which of the plurality of voltages is to be selected as one of the first and second reference voltages based on the command setting set in the command setting register from the processing device in each given cycle.

9. A display module comprising:
   the display driver according to claim 1; and
   the electro-optical panel.

10. The display driver according to claim 1, wherein each of the values of the first and second reference voltages is changed in adjacent cycles.

11. The display driver according to claim 2, wherein each of the values of the first and second reference voltages is changed in adjacent cycles.

12. The display driver according to claim 3, wherein each of the values of the first and second reference voltages is changed in adjacent cycles.

13. The display driver according to claim 4, wherein each of the values of the first and second reference voltages is changed in adjacent cycles.

14. The display driver according to claim 5, wherein each of the values of the first and second reference voltages is changed in adjacent cycles.

15. The display driver according to claim 6, wherein each of the values of the first and second reference voltages is changed in adjacent cycles.

16. The display driver according to claim 7, wherein each of the values of the first and second reference voltages is changed in adjacent cycles.

17. The display driver according to claim 8, wherein each of the values of the first and second reference voltages is changed in adjacent cycles.

18. The display module according to claim 9, wherein each of the values of the first and second reference voltages is changed in adjacent cycles.

\* \* \* \* \*